(12) United States Patent
Feick

(10) Patent No.: US 12,015,096 B2
(45) Date of Patent: Jun. 18, 2024

(54) TIME OF FLIGHT SENSOR DEVICE AND TIME OF FLIGHT SENSOR ARRANGEMENT

(71) Applicant: Infineon Technologies AG, Neubiberg (DE)

(72) Inventor: Henning Feick, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 721 days.

(21) Appl. No.: 16/807,957

(22) Filed: Mar. 3, 2020

(65) Prior Publication Data

US 2020/0287071 A1   Sep. 10, 2020

(30) Foreign Application Priority Data

Mar. 4, 2019   (EP) .................................... 19160613

(51) Int. Cl.
*H01L 31/103* (2006.01)
*H01L 27/144* (2006.01)
(Continued)

(52) U.S. Cl.
CPC ........ *H01L 31/103* (2013.01); *H01L 27/1443* (2013.01); *H01L 31/02019* (2013.01); *H01L 31/0224* (2013.01)

(58) Field of Classification Search
None
See application file for complete search history.

(56) References Cited

U.S. PATENT DOCUMENTS 7,352,454 B2 *  4/2008  Bamji .................... G01S 17/08
                                             257/E27.048
7,741,660 B2    6/2010  Mouli
                        (Continued)

FOREIGN PATENT DOCUMENTS

FR    3046495 B1    2/2018
WO    2018160721 A1  9/2018

OTHER PUBLICATIONS

Moutaye, Emmanuel R. et al., "CMOS Avalanche Photodiode Embedded in a Phase-Shift Laser Rangefinder", IEEE Transactions on Electron Devices, vol. 55, No. 12, Dec. 2008, pp. 3396-3401 (Year: 2008).*

(Continued)

*Primary Examiner* — Vincent Wall
(74) *Attorney, Agent, or Firm* — Murphy, Bilak & Homiller, PLLC

(57) ABSTRACT

According to an embodiment, a time of flight sensor device includes: a semiconductor substrate having a conversion region to convert an electromagnetic signal into photo-generated charge carriers, and including a substrate doping region having a n-doping type. The substrate doping region extends from a first main surface region of the semiconductor substrate into the semiconductor substrate. The semiconductor substrate has a p doped region adjacent to the substrate doping region. The substrate doping region at least partially forms the conversion region in the semiconductor substrate. A readout node arranged in the semiconductor substrate within the substrate doping region and having the n-doping type is configured to readout the photo generated charge carriers. A control electrode is arranged in the substrate doping region of the semiconductor substrate and in the substrate doping region and has a p-doping type.

25 Claims, 20 Drawing Sheets

(51) Int. Cl.
*H01L 31/02* (2006.01)
*H01L 31/0224* (2006.01)

(56) References Cited

U.S. PATENT DOCUMENTS

| | | | |
|---|---|---|---|
| 8,294,882 B2 | 10/2012 | Van Der Tempel et al. | |
| 8,324,549 B2 | 12/2012 | Romero et al. | |
| 8,792,087 B2 | 7/2014 | Spickermann et al. | |
| 9,893,112 B2* | 2/2018 | Na | H01L 27/1443 |
| 9,923,003 B2 | 3/2018 | Elkhatib et al. | |
| 10,126,411 B2 | 11/2018 | Gilliland et al. | |
| 11,105,928 B2* | 8/2021 | Cheng | G01S 7/4816 |
| 11,255,724 B2* | 2/2022 | Lu | G01J 1/44 |
| 11,329,081 B2* | 5/2022 | Chen | H01L 27/14614 |
| 2011/0062544 A1* | 3/2011 | Iwai | H01L 31/10 |
| | | | 257/E31.032 |
| 2016/0150174 A1* | 5/2016 | Hynecek | H01L 27/14643 |
| | | | 257/233 |
| 2017/0074643 A1* | 3/2017 | Chang | H01L 27/14614 |
| 2017/0332024 A1 | 11/2017 | Feick | |
| 2018/0090526 A1 | 3/2018 | Mandai et al. | |
| 2018/0090536 A1 | 3/2018 | Mandai et al. | |
| 2018/0190698 A1* | 7/2018 | Na | H01L 27/14612 |
| 2018/0233528 A1 | 8/2018 | Na et al. | |
| 2018/0284247 A1 | 10/2018 | Campbell et al. | |

OTHER PUBLICATIONS

Moutaye, Emmanuel R., "CMOS Avalanche Photodiode Embedded in a Phase-Shift Laser Rangefinder", IEEE Transactions on Electron Devices, vol. 55, No. 12, Dec. 2008, pp. 3396-3401.

* cited by examiner

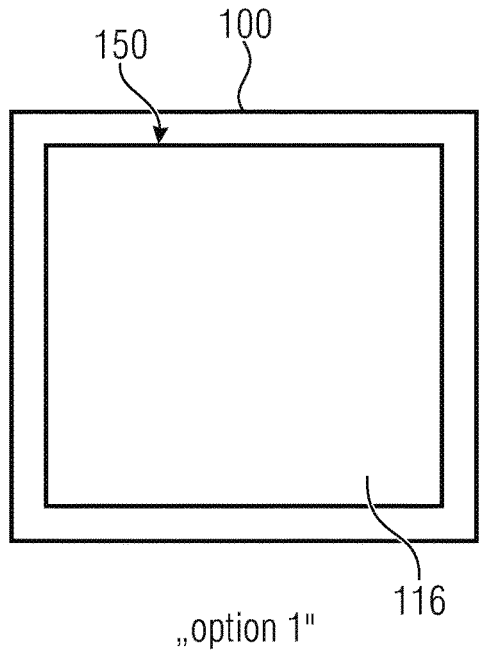
„option 1"
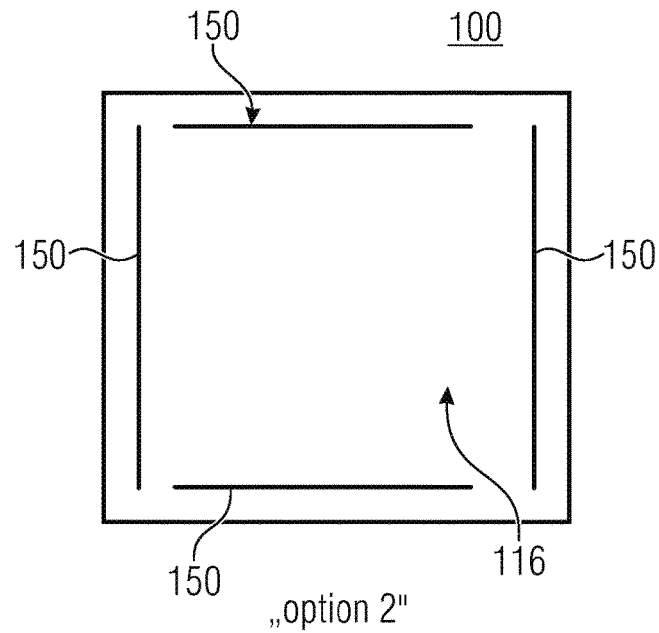
„option 2"
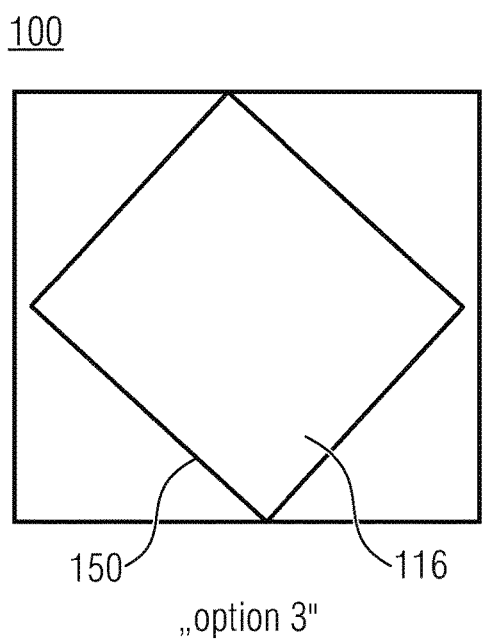
„option 3"
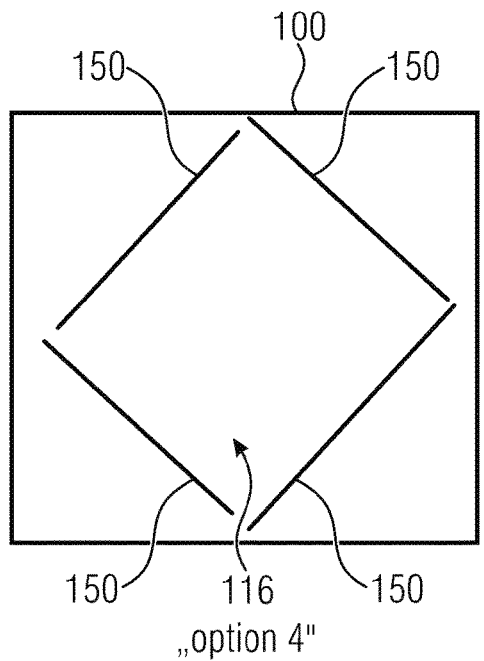
„option 4"
Fig. 3l

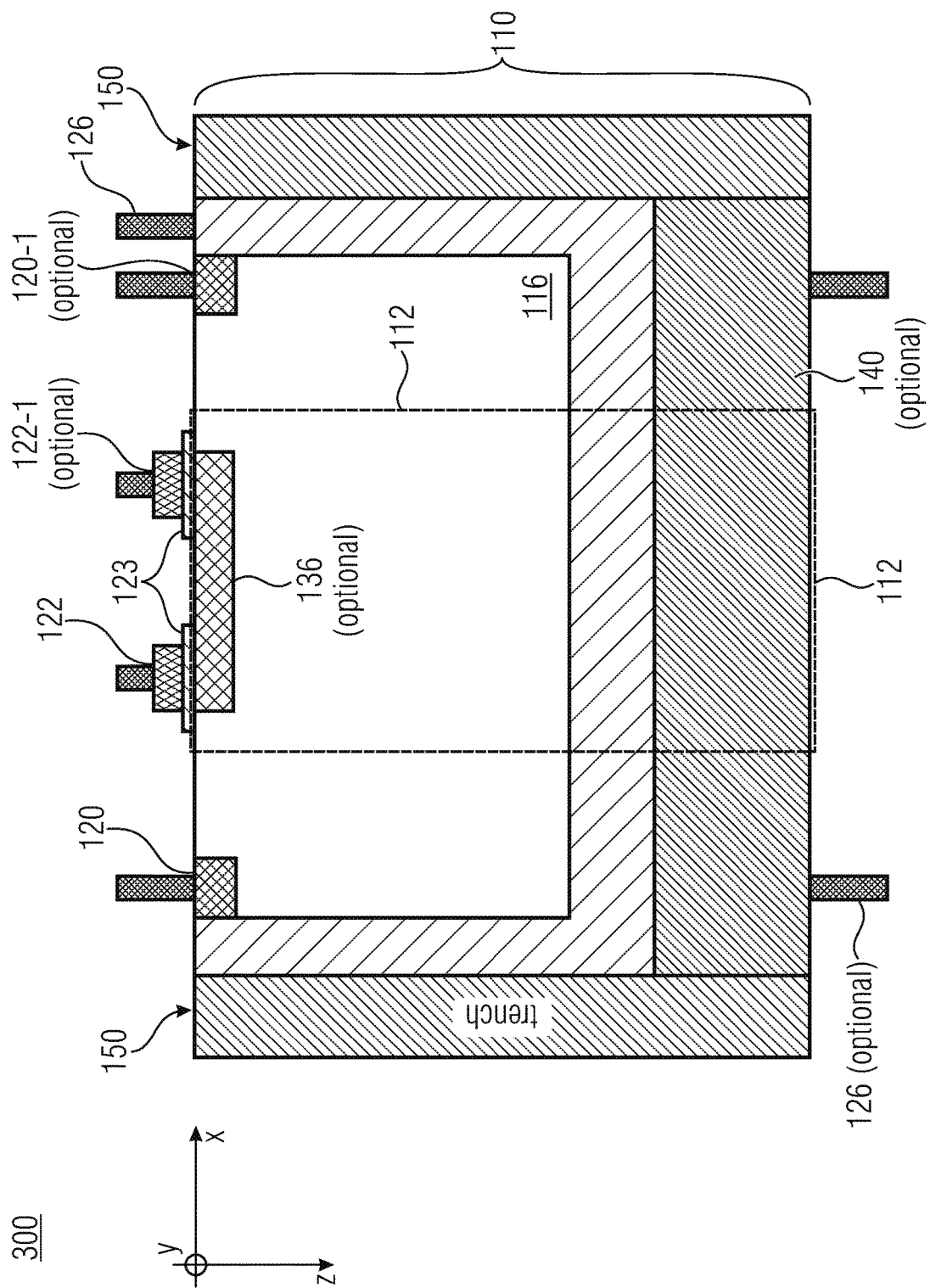

TIME OF FLIGHT SENSOR DEVICE AND TIME OF FLIGHT SENSOR ARRANGEMENT

TECHNICAL FIELD

Embodiments relate in general to the field of integrated circuits and, more specifically, to the field of optical sensor devices adapted to detect a time of flight of an electromagnetic signal. Thus, embodiments relate to a time of flight (TOF) sensor device. Further embodiments are directed to N-epi time of flight sensor device having a n-doped semiconductor region in a semiconductor substrate, e.g. bulk or epitaxial grown semiconductor substrate.

BACKGROUND

Current optical time of flight sensors employ photogate structures for redirecting photo-generated charge carriers in a semiconductor substrate to a read-out node for achieving time of flight information of an amplitude-modulated electromagnetic signal generated by a radiation source, wherein the electromagnetic signal is directed to an object and reflected to the time of flight sensor device.

However, the current design of optical time of flight sensor devices suffers from limitations of the quality of the sensor signal, i.e., on the efficiency of the transport of the photo-generated charge carries to the readout node(s), for achieving a good signal-to-noise ratio and a high temperature operability.

Therefore, there is a need for improved optical time-of-flight sensor devices with an enhanced capability to convert the received optical signal into an electrical signal.

Such a need can be solved by the time of flight sensor device according to the independent claims. In addition, specific implementations of different embodiments of the time of flight sensor device are defined in the dependent claims.

SUMMARY

According to an embodiment, a time of flight sensor device comprises: a semiconductor substrate comprising a conversion region to convert an electromagnetic signal into photo-generated charge carriers and comprising a substrate doping region having a n doping type, wherein the substrate doping region extends from a first main surface region of the semiconductor substrate into the semiconductor substrate, wherein the semiconductor substrate has adjacent to the substrate doping region a p doped region, and wherein the substrate doping region at least partially forms the conversion region in the semiconductor substrate, a readout node arranged in the semiconductor substrate within the substrate doping region and having the n-doping type, wherein the readout node is configured to readout the photo generated charge carriers; and a control electrode arranged in the substrate doping region and having the p-doping type.

According to another embodiment, a time of flight sensor device comprises: a semiconductor substrate comprising a conversion region to convert an electromagnetic signal into photo-generated charge carriers, and comprising a substrate doping region having a n doping type, wherein the substrate doping region extends from a first main surface region of the semiconductor substrate into the semiconductor substrate, wherein the semiconductor substrate has adjacent to the substrate doping region a p-doped region, and wherein the substrate doping region at least partially forms the conversion region in the semiconductor substrate, a readout node arranged in the semiconductor substrate within the substrate doping region and having the n doping type, wherein the readout node is configured to readout the photo generated charge carriers, a control electrode arranged in or on the substrate doping region of the semiconductor substrate, and a buried doping layer in the semiconductor substrate having a higher concentration of the p doping type than p-doped region of the semiconductor substrate adjacent to the substrate doping region, wherein the buried doping layer is formed in the semiconductor substrate and vertically below the substrate doping region in the semiconductor substrate.

According to another embodiment, a time of flight sensor device comprises: a semiconductor substrate comprising a conversion region to convert an electromagnetic signal into photo-generated charge carriers, and comprising a substrate doping region having a n doping type, wherein the substrate doping region extends from a first main surface region of the semiconductor substrate into the semiconductor substrate, wherein the semiconductor substrate has adjacent to the substrate doping region a p-doped region, and wherein the substrate doping region at least partially forms the conversion region in the semiconductor substrate, a readout node arranged in the semiconductor substrate within the substrate doping region and having the n doping type, wherein the readout node is configured to readout the photo generated charge carriers; a control electrode arranged in or on the substrate doping region of the semiconductor substrate, and a trench structure which is arranged laterally with respect to the substrate doping region and which extends vertically with respect to the first main surface region of the semiconductor substrate in the semiconductor substrate.

According to another embodiment, a time of flight sensor arrangement comprises: a plurality of the time of flight sensor devices, wherein the time of flight sensor devices are arranged in an array, and a controller for providing a control signal to the control electrode.

BRIEF DESCRIPTION OF THE FIGURES

Embodiments of the time of flight sensor device are described herein making reference to the appended drawings and figures.

FIG. 3I shows schematic cross sectional views of the time of flight sensor device according to further embodiments.

FIG. 6 shows a schematic cross sectional views of the time of flight sensor device according to further embodiments.

DETAILED DESCRIPTION

Before discussing the present embodiments in further detail using the drawings, it is pointed out that in the figures and the specification identical elements and elements having the same functionality and/or the same technical or physical effect are usually provided with the same reference numbers or are identified with the same name, so that the description of these elements and of the functionality thereof as illustrated in the different embodiments are mutually exchangeable or may be applied to one another in the different embodiments.

In the following description, embodiments are discussed in detail, however, it should be appreciated that the embodiments provide many applicable concepts that can be embodied in a wide variety of semiconductor devices. The specific embodiments discussed are merely illustrative of specific ways to make and use the present concept, and do not limit the scope of the embodiments. In the following description of embodiments, the same or similar elements having the same function have associated therewith the same reference signs or the same name, and a description of the such elements will not be repeated for every embodiment. Moreover, features of the different embodiments described hereinafter may be combined with each other, unless specifically noted otherwise.

It is understood that when an element is referred to as being "connected" or "coupled" to another element, it may be directly connected or coupled to the other element, or intermediate elements may be present. Conversely, when an element is referred to as being "directly" connected to another element, "connected" or "coupled," there are no intermediate elements. Other terms used to describe the relationship between elements should be construed in a similar fashion (e.g., "between" versus "directly between", "adjacent" versus "directly adjacent", and "on" versus "directly on", etc.).

For facilitating the description of the different embodiments, the figures comprise a Cartesian coordinate system x, y, z, wherein the x-y-plane corresponds, i.e. is parallel, to the first main surface region of the semiconductor substrate, and wherein the depth direction vertical to the first main surface region and into the semiconductor substrate corresponds to the "z" direction, i.e. is parallel to the z direction. In the following description, the term "lateral" means a direction parallel to the x-direction, wherein the term "vertical" means a direction parallel to the z-direction.

Figure 1A:
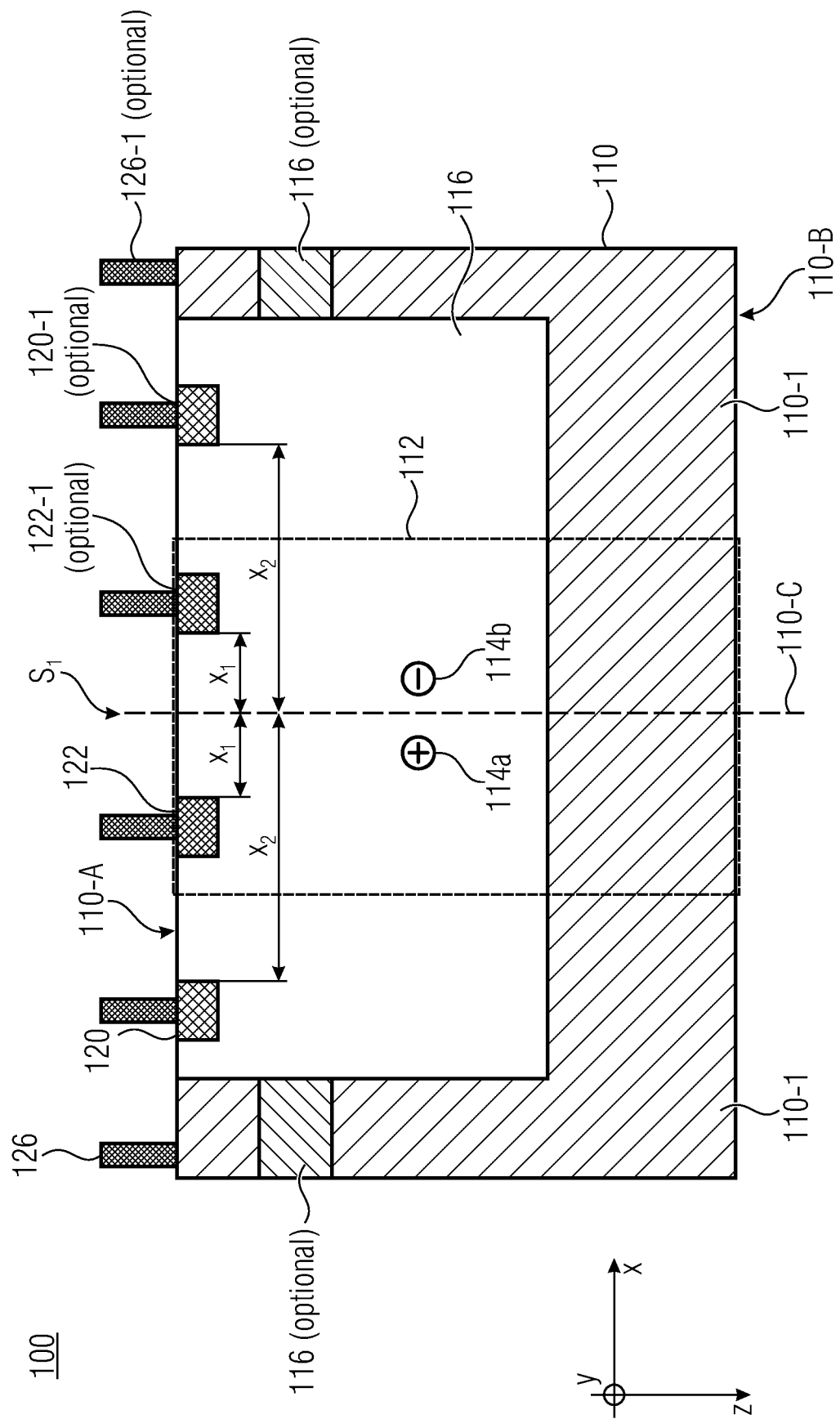
FIG. 1A shows a schematic cross sectional view of a time of flight sensor device according to an embodiment.

FIG. 1A shows a schematic cross sectional view of a time of flight sensor device 100 according to an embodiment.

As shown in FIG. 1A, the time of flight (TOF) sensor device 100 comprises a semiconductor substrate 110. The semiconductor substrate 110 for instance presents a generally rectangular cross-section along a vertical axis (i.e. in the depth direction or z direction). The semiconductor substrate 110 comprises a conversion region 112 to convert an electromagnetic signal "$S_1$" into photo-generated charge carriers 114a, 114b, wherein the semiconductor substrate 100 further comprises a substrate doping region 116 having a n-doping type. The substrate doping region 116 extends from a first main surface region 110-A of the semiconductor substrate 110, which may form a top surface thereof, into the semiconductor substrate 110 (in the depth direction or z direction). The semiconductor substrate 110 may comprise silicon, germanium or any other semiconductor material. The semiconductor substrate 110 may comprise a bulk or epitaxially grown semiconductor material.

The remaining region 110-1 of the semiconductor substrate 110-1 adjacent to the substrate doping region 116 has a p-doping type. The substrate doping region 116 at least partially forms the conversion region 112 in the semiconductor substrate 110. A readout node 120 is arranged in the semiconductor substrate 110 within the substrate doping region 116 and has the n-doping type, e.g. with a higher doping concentration than the substrate doping region 116. The readout node 120 is configured to readout the photo-generated charge carries 114b, e.g., the photo-generated electrons. The photo-generated charge carries 114b (electrons) have the same type as the minority carriers in the substrate region 110-1. The readout node 120 may be formed as an implanted doping region in the semiconductor substrate 110.

The conversion region 112 is also referred to as absorption region in the semiconductor substrate 110 for receiving the electromagnetic signal $S_1$, which is incident to first main surface region 110-A of the semiconductor substrate 110, and for generating electron-hole pairs (e/h-pairs). Thus, the portion of the incident electromagnetic signal $S_1$, which enters the conversion region 112, is at least partially converted into the photo-generated charge carriers 114a, 114b (e/h-pairs), wherein, for example, the negative charge carriers 114b (electrons) are shifted to the readout node 120.

The TOF sensor device 100 further comprises a control electrode 122 which is arranged in the substrate doping region 116 of the semiconductor substrate 110 adjacent to the first main surface region 110-A of the semiconductor substrate 110. The control electrode 122 has the p-doping type. As shown in FIG. 1A, the control electrode 122 may optionally be further arranged in the conversion region 112 adjacent to the first main surface region 110-A of the semiconductor substrate 110. The control electrode 122 may be formed as implanted doping region in the semiconductor substrate 110.

The TOF sensor device 100 may further comprise a substrate contact 126 which may be arranged at the p-doping type region 110-1 of the semiconductor substrate 110 adjacent to the substrate doping region 116. The substrate contact 126 may be arranged, for example, to receive and discharge the positive charge carriers 114a, e.g. holes, photo-generated in the conversion region 112. This may avoid a saturation of the semiconductor substrate 110 by positive charge carriers 114a (holes).

The substrate doping region 116 may comprise a n-type doping concentration (of doping atoms) in the range between 1E12 atoms/cm$^3$ and 1E16 atoms/cm$^3$, or between 1E13 atoms/cm$^3$ and 1E15 atoms/cm$^3$, for example. The substrate doping region 116 may extend between 1 µm and 100 µm, between 2 µm and 50 µm, or between 3 µm and 20 µm into the semiconductor substrate 110, for example.

It should be noted that the formulation 1EX atoms/cm$^3$ is intended to be equivalent to the formulation $10^X$ atoms/cm$^3$.

The aspect ratio of the doping region 116, that is the maximum vertical extension of the doping region 116 relative to a lateral extension of the doping region 116 may be between 0.2 and 5, in some embodiments between 0.5 and 2 and in some embodiments between 0.75 and 1.25.

According to an embodiment, the minimum doping concentration of the conversion region 112 is inside the n-doped substrate doping region 116. The minimum mean or average doping concentration may refer to a minimum number of doping atoms (independent from their charge, therefore positive and negative) per cubic-centimeter.

The p-doped region 110-1 of the semiconductor substrate 110 may comprise a p-type doping concentration (=substrate doping concentration) in the range between 1E12 atoms/cm$^3$ and 1E19 atoms/cm$^3$, or between 1E14 atoms/cm$^3$ and 1E18 atoms/cm$^3$, or between 1E15 atoms/cm$^3$ and 1E17 atoms/cm$^3$ for example.

The readout node 120 may comprise a n-type doping concentration greater than 1E14 atoms/cm$^3$ or in the range between 1E14 atoms/cm$^3$ and 1E22 atoms/cm$^3$, or between 1E16 atoms/cm$^3$ and 1E21 atoms/cm$^3$, or between 1E18 atoms/cm$^3$ and 5E20 atoms/cm$^3$, for example.

The control electrode 122 may comprise a p-type doping concentration greater than 1E14 atoms/cm$^3$ or in the range between 1E14 atoms/cm$^{-3}$ and 1E22 atoms/cm$^{-3}$, or between 1E16 atoms/cm$^3$ and 1E21 atoms/cm$^3$, or between 1E18 atoms/cm$^3$ and 5E20 atoms/cm$^3$ for example. The implanted control electrode 122 may extend up to a depth of 10 µm, 2 µm or 0.5 µm into the semiconductor substrate 110.

As shown in FIG. 1A, the substrate doping region 116 may laterally (in the ±x direction) extend beyond the conversion region 112 in the semiconductor substrate. In this case, only a part of the substrate doping region 116 contributes to the conversion region 112 in the semiconductor substrate 110.

Furthermore, the conversion region 112 may vertically (in the z-direction or depth direction) extend beyond the substrate doping region 116 in the semiconductor substrate 110, e.g., to the second main surface region 110-B of the semiconductor substrate 110. A bottom portion of the conversion region 112 is then formed by a portion of the region 110-1.

According to a further embodiment, the entire substrate doping region 116 of the semiconductor substrate 110 may be part of the conversion region 112.

The control electrode 122 in the substrate doping region 116 and adjacent to the first main surface region 110-A of the semiconductor substrate 110 may be configured to provide, based on a control signal, an electrical potential distribution in the conversion region 112 and, thus, in the substrate doping region 116 for providing a phase sensitive or runtime-sensitive demodulation of the photo-generated charge carriers 114b in the conversion region 112. Thus, the demodulation of the photo-generated charge carriers 114b may be achieved by means of a drift-based transport of the photo-generated charge carriers 114b to the respective readout node 120. A controller (not shown in FIG. 1A) may apply the control signal to the control electrode 122. Thus, the control electrode 122 is used to demodulate the photo-generated charge carriers 114b.

To summarize, one type of the photo-generated charge carriers, namely, the electrons 114b are demodulated by means of the control electrode(s) 122, wherein the other type of photo-generated charge carrier, namely the holes 114a, is not demodulated but rather flows into the common substrate contact 126.

According to an embodiment, a radiation source (not shown in FIG. 1A) generates an electromagnetic signal S$_0$, which is amplitude-modulated by a modulation signal. The electromagnetic signal S$_0$ is directed to an object (not shown in FIG. 1A) and reflected to the time of flight sensor device 100. Thus, the reflected portion S$_1$ of electromagnetic signal S$_0$ enters the conversion region 112 in the semiconductor substrate 110 and generates the photo-generated charge carriers 114a, 114b. During operation of the time of flight sensor device 100, a demodulation signal (=the control signal), which is in-phase with a modulation signal or has a fixed phase relationship to the modulation signal, is applied to the control electrode 122. The photo-generated charge carriers 114b, i.e. the electrons 114b, are directed to the readout node 120 depending on the demodulation signal applied to the control electrode 122 and based on the resulting electrical potential distribution in the substrate doping region 116. The photo-generated charge carriers 114b directed to the readout node 120 are detected and a phase shift between the modulation signal and the electromagnetic signal reflected from the object and detected at the TOF sensor device may be determined, e.g. by a processing device or controller (not shown in FIG. 1A). Therefore, the time of flight of the electromagnetic signal S$_0$ and of the reflected portion S$_1$ of the electromagnetic signal S$_0$ may be determined from the detected photo-generated carriers 114b, which are provided at the readout node 120. In other words, a mixing of the received electromagnetic radiation S$_1$ with the demodulation signal applied to the control electrode 122 is used to determine a time of flight information from the phase shift between the radiation emitted by the radiation source and the radiation received by the optical TOF sensor device 100.

The substrate doping region 116 provides for an efficient demodulation even in vertical deep lying regions of the conversion region 112 and therefore the demodulation of the photo-generated charge carriers 114b is provided deep in the semiconductor substrate 110. This in-volume demodulation avoids long path lengths and slow diffusive transport. A high electric field strength obtained provides for a fast extraction of the generated charge carriers 114b to the respective readout node.

According to an embodiment, the TOF sensor device 100 may optionally comprise a further control electrode 122-1 to optionally provide a pair of control electrodes 122, 122-1 and a further readout node 120-1 to optionally provide a pair of readout nodes 120, 120-1.

The optional further control electrode 122-1 is also arranged in the substrate doping region 116 of the semiconductor substrate 110 and has the p-doping type. As shown in FIG. 1A, the further control electrode 122-1 may also be arranged in the conversion region 112 adjacent to the first main surface region 110-A of the semiconductor substrate 110. The further control electrode 122-1 may be formed as implanted doping region in the semiconductor substrate 110. The further control electrode 122-1 may comprise the same p-type doping concentration as the control electrode 122, for example.

In case, the further control electrode 122-1 is arranged in the time of flight sensor device 100, the above description with respect to the functionality of the control electrode 122 is equally applicable to the further control electrode 122-1.

The optional further readout node 120-1 is arranged in the semiconductor substrate 110 within the substrate doping region 116 and has the n-doping type, e.g. with a higher doping concentration than the substrate doping region 116. The further readout node 120-1 is also configured to readout the photo-generated charge carries 114b, e.g., the photo-generated electrons. The further readout node 120-1 may be formed as further implanted doping region in the semiconductor substrate 110. The further readout node 120-1 may comprise the same n-type doping concentration as the readout node 120.

In case, the further readout node 120-1 is arranged in the time of flight sensor device 100, the above description with respect to the functionality of the readout node 120-1 is equally applicable to the further readout node 120-1.

Thus, the readout nodes 120, 120-1, and the control electrodes 122, 122-1 can be arranged pairwise in the substrate doping region 116 and optionally in the conversion region 112 as well, wherein the pair of readout nodes 120, 120-1 may be symmetrically arranged with respect to a symmetry line 110-C (=on opposing sides of the center line 110-C), which extends parallel to the z-direction, wherein the pair of control electrodes 122, 122-1 may be also arranged symmetrically with respect to the symmetric line 110-C (=on opposing sides of the center line 110-C). Thus, the pairwise arranged readout nodes 120, 120-1 may each have the same distance $x_1$ parallel to the x-direction from the center line (symmetry line) 110-C, wherein further the pairwise arranged control electrodes 122, 122-1 may each have the same distance $x_2$ parallel to the x-direction from the center line 110-C.

The above described demodulation concept may be further applied to the pairwise arranged control electrodes 122, 122-1 and pairwise arranged readout nodes 120, 120-1 in that the photo-generated charge carriers 114b are directed to the first readout node 120 and subsequently to the second readout node 120-1 depending on the demodulation signal applied to the respective control electrode 122, 122-1. The photo-generated charge carriers 114b (e.g. the electrons) directed to the respective readout node 120, 120-1 are detected and a phase shift between the modulation signal and the electromagnetic signal $S_1$ reflected from the object and detected at the time of flight sensor device 100 is derivable. Thus, a mixing of the received radiation $S_1$ with a demodulation signal is used to determine time of flight information from the phase shift between the emitted radiation $S_0$ from the radiation source and the radiation $S_1$ received by the optical time of flight sensor device 100.

As shown in FIG. 1A, a further substrate contact 126-1 may be optionally provided at the p-doped region 110-1 of the semiconductor substrate 110. In case, the further substrate contact 126-1 is arranged, the above description with respect to the functionality of the substrate contact 126-1 is equally applicable to the further substrate contact 126-1.

According to the embodiment of FIG. 1A, the control electrode 122 and the optional further control electrode 122-1 are formed as p-doping regions in the substrate doping region 116 having a n-doping type. Based on the control electrode 122, 122-1, a control signal (demodulation signal) applied to the respective control electrode 122, 122-1 creates an electric field with relatively deep equipotential lines in the semiconductor substrate so that the demodulation of the photo-generated charge carriers can be extended relatively deep into the semiconductor substrate 110 and provides an efficient demodulation of the photo-generated charge carriers. This effect can be efficiently achieved as the at least one "implanted" control electrode 122, 122-1 can extend relatively deep into the semiconductor substrate 110.

As the at least one p-doped control electrode 122, 122-1 of the optical time of flight sensor device 100, as described with respect to FIG. 1A, is arranged in the substrate doping region 116 of the semiconductor substrate 110, e.g. as implanted doping region, an absorption loss of the incident electromagnetic signal $S_1$, which enters the conversion region 112, may be avoided or at least reduced when compared to a control electrode design in form of metallization or polysilicon regions with an intermediate insulator layer on the main surface region 110-A of the semiconductor substrate 110.

Moreover, as the at least one p-doped control electrode 122, 122-1 of the optical time of flight sensor device 100, as described with respect to FIG. 1A, is arranged in the substrate doping region 116 of the semiconductor substrate 110, e.g. as implanted doping region, a reduced leakage (shot noise) may be achieved. The leakage (shot noise) may result from electron/hole pair generation at the interface, e.g. a silicon-silicon dioxide interface at the first main surface region 110-a of the semiconductor substrate 110, and may be efficiently reduced by the design of the "implanted" control electrode(s) 122, 122-1. Thus, the time of flight sensor device 100 may provide a high signal-to-noise ratio (SNR) due to the reduced dark current from e/h pair-generation, for example, at an oxide interface inherent.

According to an embodiment, the optical time of flight sensor device 100 forms part of a device known as a pixel, which may further comprise further components, e.g. processing circuitry. This pixel itself forms part of a two-dimensional integrated pixel array for receiving optical visible or infrared radiation emitted by a light source and reflected by an object to be sensed, wherein the respective pixels provide an electrical output signal for determining a distance to the object by measuring the time-of-flight (travelling time) of the optical visible or infrared radiation. It should be noted that the time of flight sensor device 100 can be used in an apparatus comprising a single pixel, or within such an of an array of pixels.

As further illustrated in FIG. 1A, and whether in the corresponding embodiment or in any embodiment of the invention, optionally, the substrate doping region 116 extends to one or more side, i.e. lateral edge, of the sensor device 100 over at least part of the height of the sensor device 100. For instance, it so extends only over part of the height of the substrate doping region. For instance, the p-doped region 110-1 comprises a portion located adjacent and beneath the substrate contact 126 and/or the further substrate contact 126-1. Alternatively, the substrate doping region 116 extends to the main surface region 110-A in the vicinity of the corresponding lateral edge of the sensor device 100.

For instance, the side or sides of a given sensor device 100 to which the substrate doping region 116 extends is a function of a location of the considered sensor device 100 within the pixel array.

For a non-edge sensor device 100, i.e. a sensor device 100 having no lateral edge forming an outer boundary of the array, the substrate doping region 116 may extend to all the lateral edges of the sensor device.

For an edge sensor device 100, i.e. a sensor having one or more lateral edge forming an outer boundary of the array, the substrate doping region 116 may not extend to the corresponding lateral edge(s) of the sensor device 100, and the corresponding lateral edge(s) is formed by the material of the p-doped region 110-1.

Within the array, two neighboring sensor devices 100 may be in contact with each other laterally, in which case their respective substrate doping regions 116 may be in contact with each other in the region of the lateral edges of the sensor devices 100.

Alternatively, neighboring sensor devices 100 within the array may not be in contact with each other.

In some embodiments, whether that of FIG. 1A or any other, on one or more side of the sensor device 100, the region 110-1 is arranged so as to form of a wall stretching over the entire span of the side of the sensor device 100. It may stretch vertically over the entire height of the sensor device, or only over part of it, in which case the substrate doping region 116-1 may extend to the side 100-1 of the sensor device above the region 110-1.

Figure 1B:
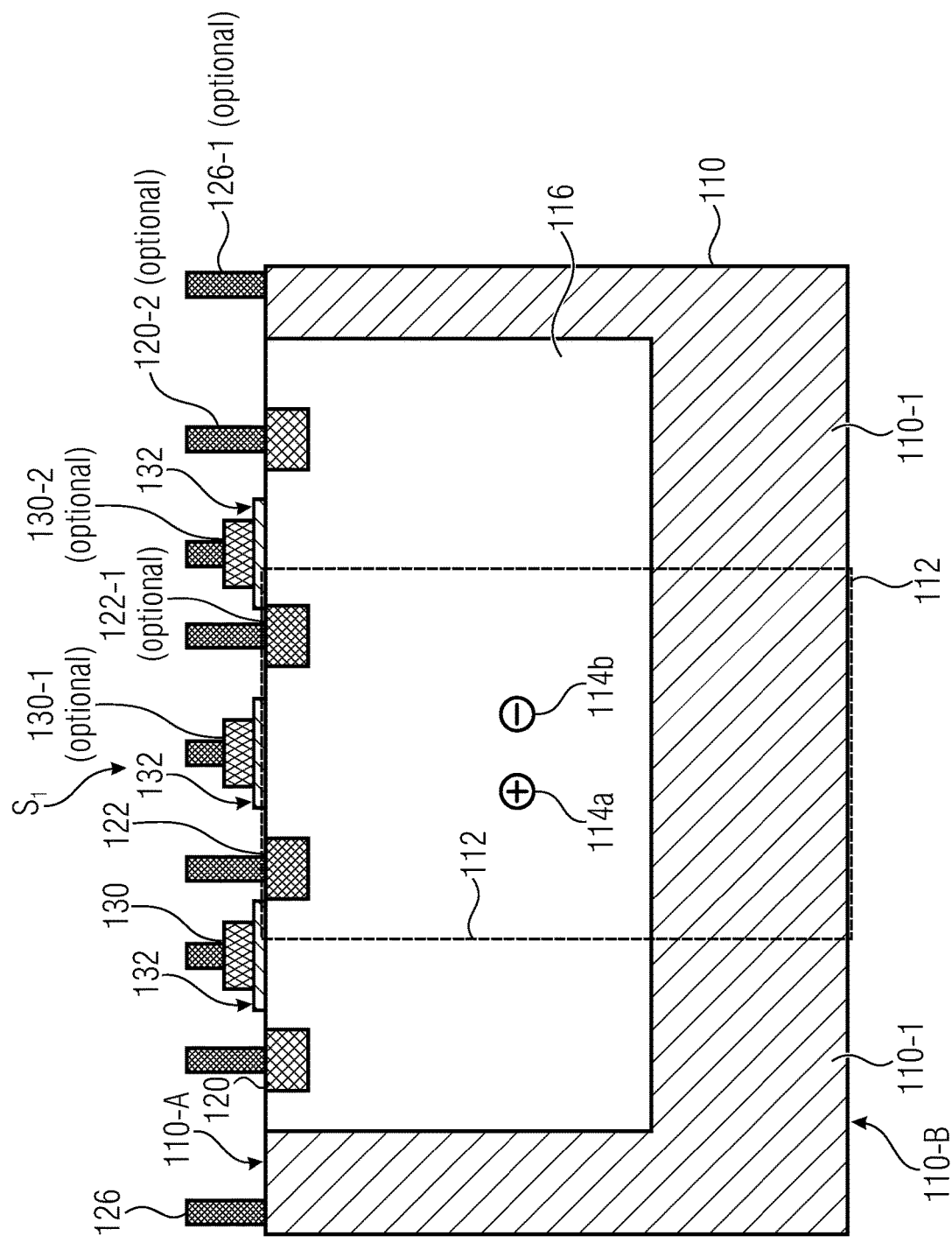
FIGS. 1B-1C show schematic cross sectional views of the time of flight sensor device according to further embodiments.
Figure 1C:
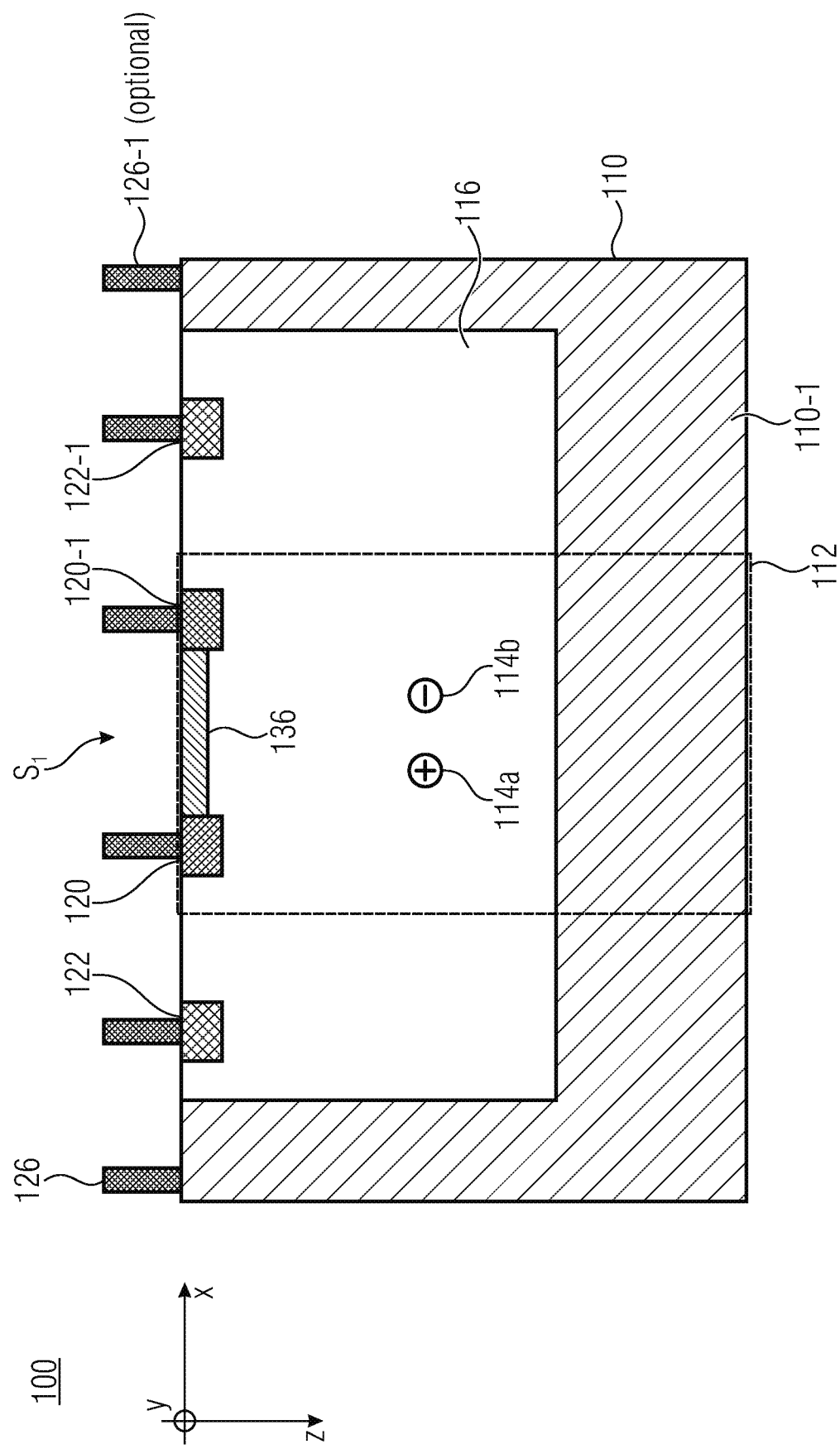
Figure 1D:
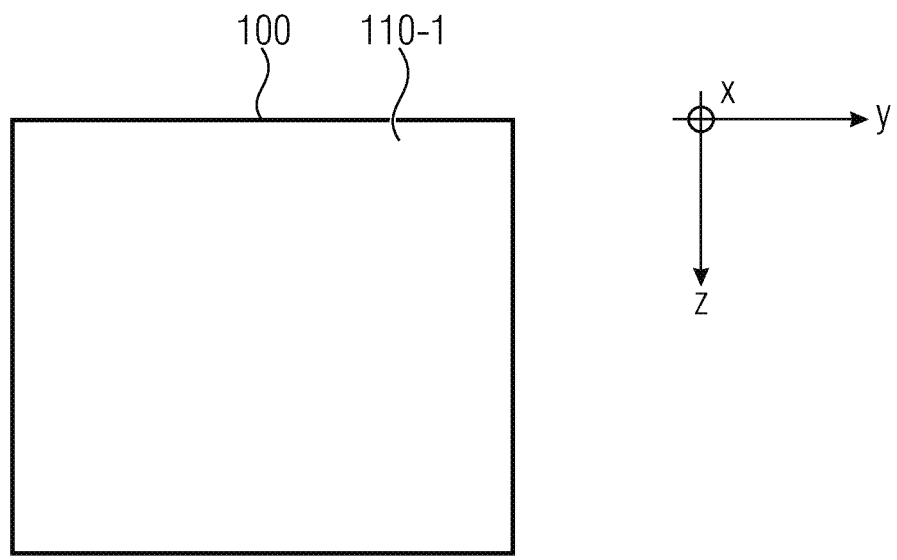
FIGS. 1D-1E show schematic cross sectional views along a vertical axis of the time of flight sensor device according to further embodiments.

FIG. 1D shows a schematic cross sectional view of the time of flight sensor device 100, wherein the drawing plane is parallel to the y-z-plane (=perpendicular to the drawing plane of FIG. 1A). As shown in FIG. 1D, the region 110-1 is arranged so as to form of a wall stretching over the entire span of the side of the sensor device 100.

Figure 1E:
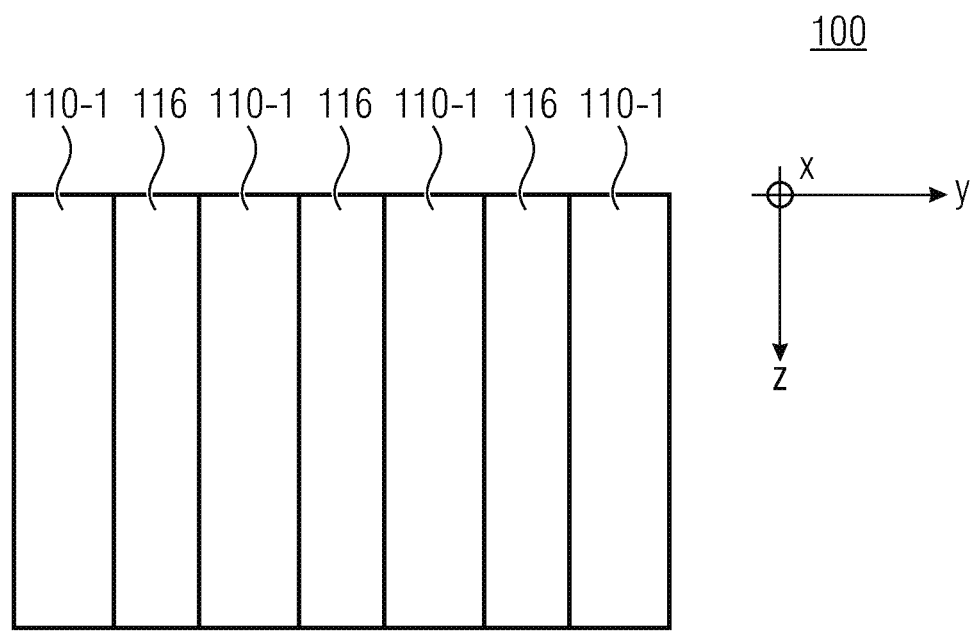

However, alternatively, the region 110-1 is arranged so to as form a plurality of vertical columns with gaps therebetween. The substrate doping region 116 then extends to the corresponding side of the sensor device 100 between the gaps formed between the columns, as schematically shown in FIG. 1E.

On the sides of the sensor device 100, the matter of the region 110-1 may be formed e.g. by epitaxial growth or by implantation, whether in a same process step as the remainder of the region 110-1, or in a prior or subsequent step.

In the following, a number of different possible implementations of the time of flight sensor device 100 are exemplarily described.

In the present description of embodiments, the same or similar elements having the same structure and/or function are provided with the same reference numbers or the same name, wherein a detailed description of such elements will not be repeated for every embodiment. Thus, the above description with respect to FIG. 1A is equally applicable to the further embodiments as described below. In the following description, essentially the differences, e.g. additional elements, to the embodiment as shown in FIG. 1A and the technical effect(s) resulting therefrom are discussed in detail.

FIG. 1B shows a schematic cross sectional view of an optical time of flight sensor device according to a further embodiment.

As shown in FIG. 1B, a sensor electrode 130, e.g. a so-called separation gate or photogate (modulation gate), which is optionally separated by an isolating material 132 form the semiconductor substrate 110 may be arranged on the first main surface region 110-A of the semiconductor substrate 110. As shown in FIG. 1B, the sensor electrode 130 may be arranged in a lateral direction between the control electrode 122 and the readout node 120. The sensor electrode 130 may be configured to modify, based on a further control signal applied thereto, an electric potential distribution in the substrate doping region 116, e.g. between the control electrode 122 and the readout node 120. The sensor electrode 130 may provide a capacitive decoupling of the control electrode 122 and the readout node 120 to prevent crosstalk or biasing from the control electrode 122 to the readout node 120.

According to an embodiment, the sensor electrode 130 may be arranged on the first main surface region 110-A of the semiconductor substrate 110 laterally neighboring the at least one readout node 120. The sensor electrode 130 may support retaining the collected or directed charge carriers even in case the potential applied to the control electrode 122 is removed. To this end, a constant potential, e.g., a constant positive voltage in case of an n-type substrate doping region 116, may be applied to the further control electrode 130. The amplitude of the potential applied to the further control electrode 130 may be less than the amplitude of the reverse voltage applied to the readout node 120 but may be higher than the maximum potential applied to the control electrode 122.

As shown in FIG. 1B, the time of flight sensor device 100 may optionally comprise the further control electrode 122-1 and the further readout node 120-1, wherein a further sensor electrode 130-1, which is separated by an isolating material 132 from the semiconductor substrate 110, may be arranged on the substrate doping region 116, e.g. laterally between the further control electrode 122-1 and the further readout node 120-1.

In case the further control electrode 122-1, the further readout mode 120-1 and the further sensor electrode 130-1 are arranged in the time of flight sensor device 100, the above description with respect to the functionality of the sensor electrode 130 in view of the control electrode 122 and the readout node 120 is equally applicable to the further sensor electrode 130-1 in view of the further control electrode 122-1 and the further readout node 120-1.

To summarize, as shown in FIG. 1B, a sensor electrode 130 may be provided on the first main surface region 110-A of the semiconductor substrate 110 in combination with the control electrode 122 for redirecting the photo-generated charge carriers to the readout node 120.

Moreover, the further sensor electrode 130-1 may be optionally provided on the first main surface region 110-A of the semiconductor substrate 110 in combination with the further control electrode 122-1 for redirecting the photo-generated charge carriers to further readout node 120-1.

Moreover, further sensor electrodes 130-2, . . . , may be provided on the first main surface region 110-A of the semiconductor substrate 110 for redirecting the photo-generated charge carriers to respective readout node 120, 120-1.

Based on the combination of the at least one control electrode 122, 122-1 with the at least one sensor electrode 130, 130-1, 130-2, . . . (e.g. a separation gate electrode or photogate electrode), an efficient demodulation of the photo-generated charge carriers in the conversion region 112 is achieved.

FIG. 1C shows a schematic cross sectional view of the time of flight sensor device 100 according to a further embodiment.

As shown in FIG. 1C, the time of flight sensor device comprises the control electrodes 120, 120-1 and the associated readout nodes 122, 122-1. Further, the substrate contact 126 and, optionally, the further substrate contact 126-1 are provided. As shown in FIG. 1C, a further doping region having a p-doping type may be arranged between the control electrodes 120, 120-1 in the substrate doping region 116 adjacent to the first main surface region 110-A of the semiconductor substrate 110. The further doping region forms a surface pinning layer 136 and may be formed by implantation of dopants at the first main surface region 110-A of the semiconductor substrate 110. The pinning layer 136 as well as the at least one control electrode 122, 122-1 may be formed as implanted doped regions, e.g. during the same implanting step.

The pinning layer 136 may comprise a p-type doping concentration greater than 1E14 atoms/cm$^3$, such as between 1E14 atoms/cm$^3$ and 1E18 atoms/cm$^3$, or between 1E15 atoms/cm$^3$ and 1E17 atoms/cm$^3$, or between 5E15 atoms/cm$^3$ and 5E16 atoms/cm$^3$, for example.

Thus, the pinning layer 136 in form of a p-doped resistive region of the semiconductor substrate 110 adjacent to the first main surface region 110-A and between the two control electrodes (demodulation electrodes) 122, 122-1 is configured to suppress or at least reduce a leakage current generation in the semiconductor substrate 110 adjacent to the first main surface region 110-A thereof. The doping concentration of the resistive pinning layer provides for a high resistivity, so that a low or suppressed leakage (shot noise) from electron/hole pair generations at the first main surface region 110-A of the semiconductor substrate 110, i.e., at the semiconductor/oxide interface, may be achieved. Thus, the transport of the photo-generated charge carriers (electrons) 114b from the conversion region 112 to the respective readout node 120, 120-1 may be spatially kept away from the regions of the semiconductor substrate 110 directly adjacent to the first main surface region 110-A.

Figure 2A:
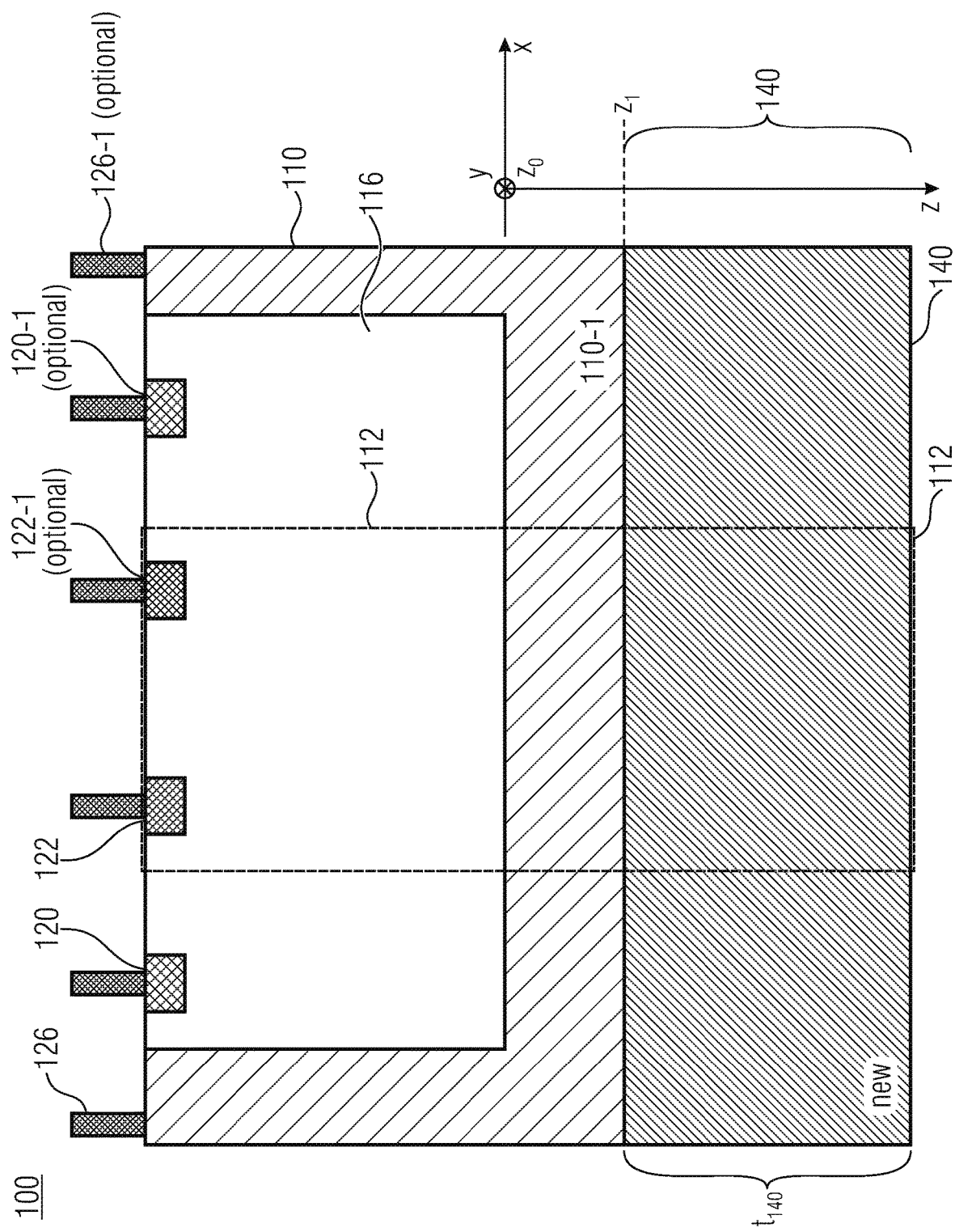
FIG. 2A shows a schematic cross sectional view of the time of flight sensor device according to a further embodiment.

FIG. 2A shows as schematic cross sectional view of the time of flight sensor device 100 according to a further embodiment.

The time of flight sensor device as shown in FIG. 2A may be implemented as described with respect to FIGS. 1A-C, wherein the time of flight sensor device 100 further comprises a buried doping layer 140 in the semiconductor substrate 110. Thus, the above description with respect to FIG. 1A-C is equally applicable to the further embodiments as described below.

The time of flight sensor device 100 comprises a semiconductor substrate 110 comprising a conversion region 112 to convert an electromagnetic signal $S_1$ into photo-generated charge carriers 114a, 114b, and comprising a substrate doping region 116 having a n-doping type, wherein the substrate doping region 116 extends from a first main surface region 110-A of the semiconductor substrate 110 into the semiconductor substrate 110. The semiconductor substrate 110 has adjacent to the substrate doping region 116 a p-doped region 110-1. The substrate doping region 116 at least partially forms the conversion region 112 in the semiconductor substrate 110. At least one readout node 120, 120-1 arranged in the semiconductor substrate 110 within the substrate doping region 116 and having the n-doping type, wherein the at least one readout node 120, 120-1 is configured to readout the negative charge carriers 114b. At least one control electrode 122, 122-1 is arranged in the substrate doping region 116 of the semiconductor substrate 110 and in the substrate doping region 116 and having the p-doping type.

The buried doping layer 140 is arranged in the semiconductor substrate vertically (in the z-direction) below the substrate doping region 116 and the p-doped region 110-1 of the semiconductor substrate 110. The buried doping layer 140 may, for example, extend to the second main surface region 110-B of the semiconductor substrate 110. The buried doping layer 140 may be a part of the p-doped region 110-1 of the semiconductor substrate 110. The buried doping layer 140 has a higher p-type doping concentration than the p-doped region 110-1 of the semiconductor substrate 110 adjacent to the substrate doping region 116.

As shown in FIG. 2A, the conversion region 112 extends into the buried doping region 140, wherein a portion of the buried doping layer 140 contributes to or is part of the conversion region 112 in the semiconductor substrate 110.

According to a further embodiment, the complete buried doping region 140 may be part of the conversion region 112.

According to a further embodiment (not shown in FIG. 2A) the buried doping layer 140 may be arranged in the semiconductor substrate 110 in the z-direction directly adjacent to the substrate doping region 116 in the semiconductor substrate 110. Thus, the buried doping layer 140 may also form the p-doped region 110-1 of the semiconductor substrate 110.

As shown in FIG. 2A, the buried doping layer 140 is formed in the semiconductor substrate 110 vertically below in the depth direction (z-direction) the substrate doping region 116 and, for example, vertically offset in the depth direction of the semiconductor substrate 110 to the substrate doping region 116.

Figure 2B:
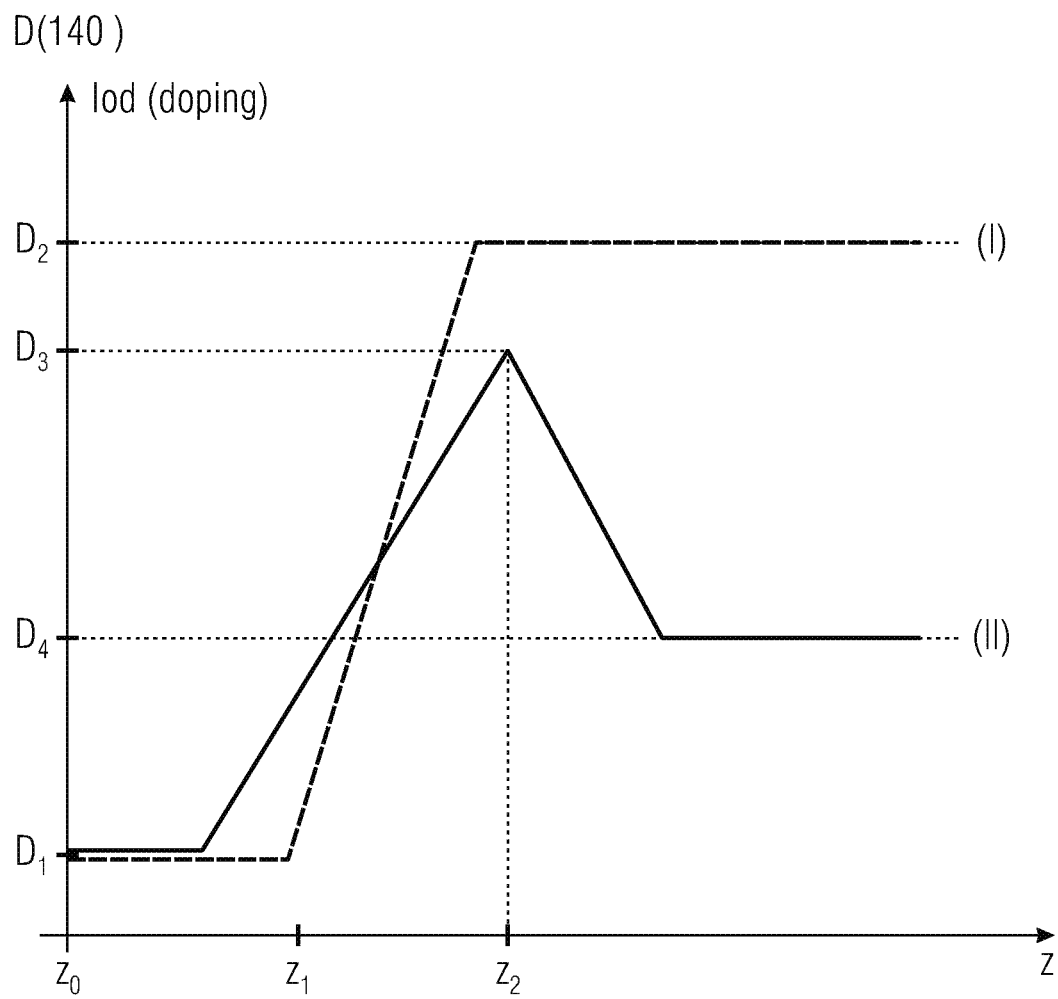
FIG. 2B shows a schematic plot of the doping concentration of the buried doping layer as shown in FIG. 2A in the depth direction (z-direction) of the semiconductor substrate.

FIG. 2B shows two exemplary alternatives I, II of the doping profile $D_{140}$ of the buried semiconductor layer 140 in the depth direction (=z-direction) of the semiconductor substrate 110.

As shown in FIG. 2B, according to a first alternative "I" of the doping concentration D, the buried doping layer 140 has a continuously (or monotonically) increasing p-type doping concentration $D_{140-1}$ starting at the depth $z_1$ (=at the plane parallel to the x-y-plane at the depth position $z_1$) with a first doping concentration $D_1$ up to a maximum doping concentration $D_2$.

According to a second alternative "II" of the doping concentration D, the buried doping layer 140 provides a graded doping profile in the semiconductor substrate 110 below the substrate doping region 116. The graded doping profile "II" has a maximum doping concentration $D_3$ of the p-doping type in an intermediate region at the depth $z_2$ (=at a plane parallel to the x-y-plane at the depth position $z_2$) of the buried doping layer 140. Thus, the buried doping layer 140 comprises an exponentially decreasing doping concentration $D_{140-2}$ from the intermediate region $z_2$ of the buried doping layer 140 in the depth direction to the second main surface region 110-B.

The doping concentration $D_1$ may comprise a p-type doping with a doping concentration up to 1E15 atoms/cm$^3$ or 1E12 atoms/cm$^3$, for example.

The doping concentration $D_2$ may comprise a p-type doping in the range between 1E17 atoms/cm$^3$ and 1E20 atoms/cm$^3$, or between 5E17 atoms/cm$^3$ and 5E19 atoms/cm$^3$, for example.

The doping concentration $D_3$ may comprise a p-type doping in the range between 1.1E15 atoms/cm$^3$ and 1E20 atoms/cm$^3$, or between 5E17 atoms/cm$^3$ and 5E19 atoms/cm$^3$, for example.

The doping concentration $D_4$ may comprise a p-type doping in the range between 1E12 atoms/cm$^3$ and 1E18 atoms/cm$^3$, or between 1E14 atoms/cm$^3$ and 1E17 atoms/cm$^3$, for example.

The buried doping layer 140 may comprise typical or minimum thickness $t_{140}$ in the range between 1 µm and 30 µm, or between 3 µm and 10 µm, for example.

In case, the buried doping layer 140 extends to the second main surface region 110-B of the semiconductor substrate 110, the thickness $t_{140}$ of the buried doping layer 140 may be up to 200 µm or 300 µm.

The buried doping layer 140 according to alternative I or II provides a drift field for minority carriers drifting the photo-generated electrons in the direction of the main surface and towards the substrate doping region 116.

Moreover, the graded doping profile according to alternative II of the buried doping layer 140 provides a electrostatic barrier for photo-generated charge carriers generated in semiconductor regions of the semiconductor substrate 110 extending in the depth direction beyond the depth position $z_2$ of the buried doping layer 140 having the maximum doping concentration $D_3$. Thus, photo-generated charge carriers 114a, 114b in deeper regions of the semiconductor substrate 110 laterally diffuse and do not affect or negatively influence the demodulation of the photo-generated charge carriers in the substrate doping region 116. Thus, the p-type buried doping layer 140 effectively suppresses or at least reduces that "slow" (diffusing) charge carriers photo-generated in deeper regions of the semiconductor substrate 110 reach the substrate doping region 116.

Moreover, the at least control electrode 122, 122-1 in the n-doped substrate doping region 116 provides in combination with the p-doped buried doping layer 140 an effective electrical drift field for the photo-generated charge carriers 114b (electrons) in the substrate doping region 116 for a drift-based transport of the photo-generated charge carriers 114b to the respective readout node 120, 120-1.

Based on the p/n-junction between the p-doped buried doping layer 140 (or the p-doped region 110-1 of the semiconductor substrate 110) and the n-doped substrate doping region 116, the electrical drift field for the photo-generated charge carriers extend in relatively deep regions of the substrate doping region 116.

To summarize, based on the p-doped buried doping layer 140, a relatively slow diffusion of photo-generated charge carriers to the surface 110-A of the semiconductor substrate 110 can be suppressed or at least reduced, which charge carriers would otherwise adversely affect the resulting demodulation contrast.

Moreover, the graded doping profile I, II of the buried of the doping layer 140 as shown in FIG. 2B provides for an effective drift field for the photo-generated charge carriers 114b so that the sensitive volume, i.e. the demodulation volume with photo-generated charge carriers constructively contributing to the sensor output signal, can be increased, and a fast charge carrier extraction can be achieved.

Furthermore, according to the graded doping profile of the second alternative shown in FIG. 2B, slow, e.g. diffusing, charge carriers can be rejected by the downward grading of the doping profile (beyond the depth position $z_2$) towards the substrate backside 110-B, i.e., the second main surface region 110-B of the semiconductor substrate 110.

As exemplarily shown in FIG. 2A-B, the control electrode(s) 122, 122-1 of the time of flight sensor device 100 may arranged in the substrate doping region 116 of the semiconductor substrate 110 and may have the p doping type, e.g. as an implanted p doping region in the semiconductor substrate 110. Thus, the control electrode(s) 122, 122-1 of the time of flight sensor device 300 may correspond to the control electrode(s) 122, 122-1 of the time of flight sensor device 100 (e.g. as described with respect to FIGS. 1A-C).

Alternatively, the control electrode(s) 122, 122-1 of the time of flight sensor device 100 may be arranged on the substrate doping region 116 of the semiconductor substrate 110 and may be separated by an insulating material 123 from the semiconductor substrate, e.g. in form of a metallization or polysilicon region 122, 122-1 with an intermediate insulator layer 123 on the main surface region 110-A of the semiconductor substrate 110

Figure 3A:
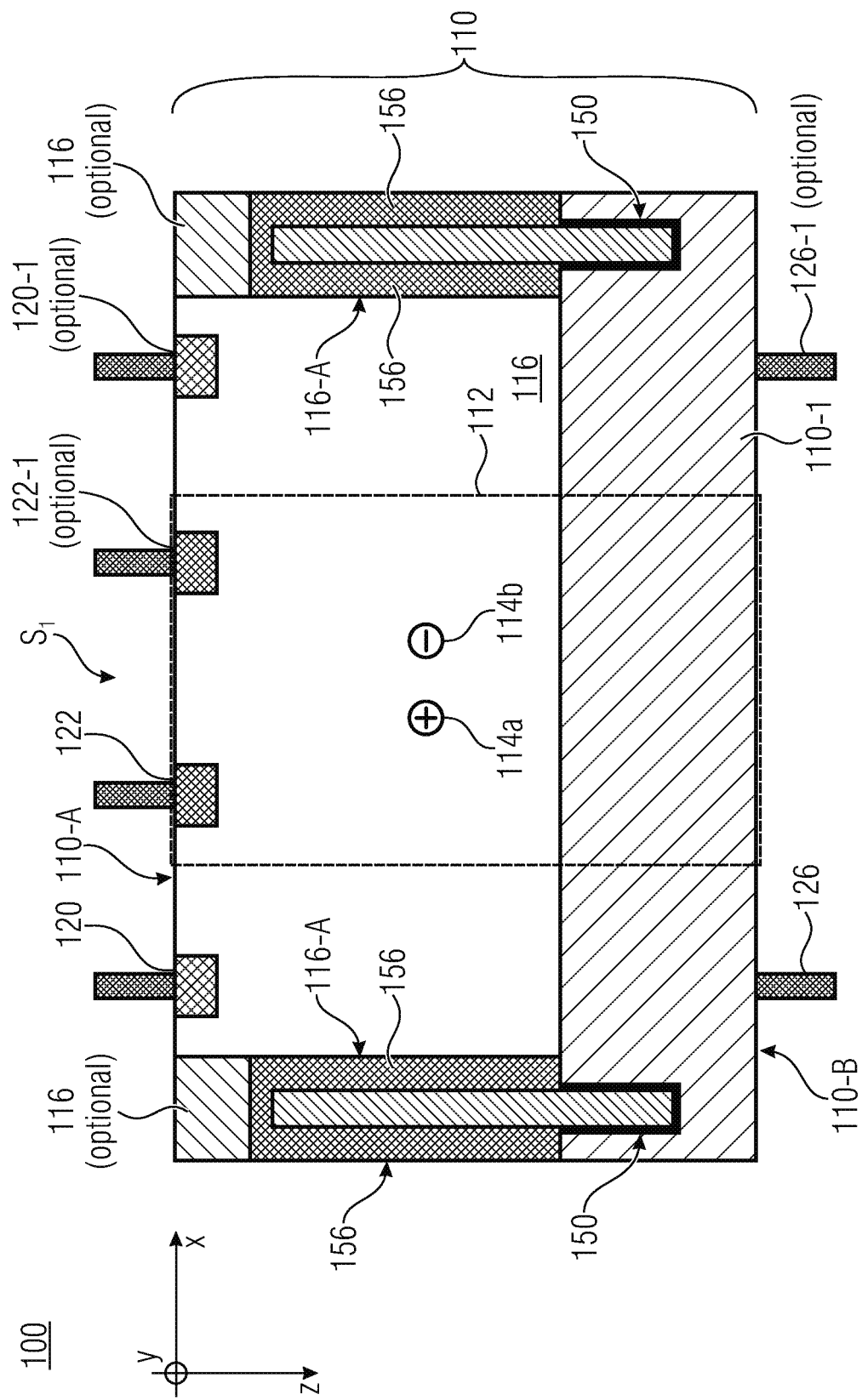
FIGS. 3A-3H show schematic cross sectional views of the time of flight sensor device according to further embodiments.

FIG. 3A shows a schematic cross sectional view of the time of flight sensor device 100 according to a further embodiment.

The time of flight sensor device as shown in FIG. 3A may be implemented as described with respect to FIGS. 1A-C, 2A-B wherein the time of flight sensor device 100 further comprises a trench structure 150 in the semiconductor substrate 110. Thus, the above description with respect to FIGS. 1A-C and 2A-B is equally applicable to the further embodiments as described below.

The time of flight sensor device 100 comprises a semiconductor substrate 110 comprising a conversion region 112 to convert an electromagnetic signal $S_1$ into photo-generated charge carriers 114a, 114b, and comprising a substrate doping region 116 having a n-doping type, wherein the substrate doping region 116 extends from a first main surface region 110-A of the semiconductor substrate 110 into the semiconductor substrate 110. The semiconductor substrate 110 has adjacent to the substrate doping region 116 a p-doped region 110-1. The substrate doping region 116 at least partially forms the conversion region 112 in the semiconductor substrate 110. At least one readout node 120, 120-1 arranged in the semiconductor substrate 110 within the substrate doping region 116 and having the n-doping type, wherein the at least one readout node 120, 120-1 is configured to readout the photo generated charge carriers 114b. At least one control electrode 122, 122-1 is arranged in the substrate doping region 116 of the semiconductor substrate 110 and in the substrate doping region 116 and having the p-doping type.

Furthermore, the time of flight sensor device 100 according to the further embodiment comprises a trench structure 150, which is configured e.g. to suppress or at least reduce cross-talking between adjacent sensor devices 100 within the array.

The trench structure 150 extends vertically in the sensor device. According to an embodiment, it presents a spatial arrangement which is symmetrical relative to a central axis of the device. This central axis is for instance defined as a vertical axis (stretching along the z direction) passing through the middle of the segment between the readout nodes 120 and 120-1.

FIG. 3I shows a schematic cross sectional views of the time of flight sensor device 100, wherein the drawing plane is parallel to the x-y-plane (=perpendicular to the drawing plane of FIG. 3A).

For instance, the trench structure 150 presents a cross-section along a vertical axis of the sensor device 100 which is generally quadrilateral, such as diamond-shaped, rectangular or square.

The trench structure may be arranged so that the sides of its quadrilateral cross-section are parallel to the sides of the sensor device, see FIG. 3I—options 1 and 2. In such a configuration, the trench structure is for instance arranged in the periphery of the sensor device 100. The trench structure 150 may consist of a single continuous trench, see FIG. 3I—option 1. Alternatively, it comprises a plurality of trenches at a distance from each other and which each stretch along a side of the quadrilateral shape of the trench structure 150, see FIG. 3I—option 2.

Alternatively, the trench structure 150 is rotated relative to the sides of the sensor device 100, for instance by 45°. For instance, the sides of the cross-section of the trench structure 150 stretch along planes intersecting the middle of a face of the sensor device 100 and the middle of a neighboring face, see FIG. 3I—options 3 and 4. The trench structure 150 may consist of a single continuous trench, see FIG. 3I—option 3. Alternatively, it comprises a plurality of trenches at a distance from each other which each stretch along a side of the quadrilateral shape of the trench structure 150, see FIG. 3I—option 4.

The trench structure 150 is arranged laterally with respect to all or part of the substrate doping region 116.

The trench structure 150 may border at least a portion of the lateral side face 116-A of the substrate doping layer 116. In other words, it may be arranged in the semiconductor substrate to at least partially or completely laterally surround or enclose the substrate doping region 116.

In the example of FIG. 3A, the trench structure 150 is arranged directly adjacent to a lateral side face 116-A of the substrate doping region 116 over all or part of the height of the substrate doping region 166. Thus, in the corresponding locations, the substrate doping region 116 may completely extend between the opposing portions of the laterally arranged trench structure 150. In such a configuration, the at least one substrate contact 126, 126-1 may be arranged as a back side contact at the second main surface region 110-b of the semiconductor substrate 110 or may be laterally arranged in contact with the p-doped region 110-1 of the semiconductor substrate 110 (not shown in FIG. 3A).

The trench structure 150 may form an outer edge of the sensor device 100 over part of the circumference of the later. Alternatively, the trench structure 150 may be buried in the semiconductor substrate 110.

As shown in FIG. 3A, the trench structure 150 may extend within the semiconductor substrate 110 to or into the p-doped region 110-1 of the semiconductor substrate 110 all the way to a bottom surface of the sensor device 100. Alternatively, it ends at a distance from the bottom surface 110-B of the sensor device 100.

Moreover, the trench structure 150 may end at a distance from the first main surface region 110-A. The substrate doping region 116 may thus extend to the lateral edge of the sensor device 100 above the trench structure, and optionally between the trench structure 150 and the first main surface region 110-A.

Alternatively, the trench structure may extend all the way to the first main surface region 110-A.

The inner volume of the trench structure 150 may be filled with a dielectric material or may comprise an empty space (void or gas), for instance so as to cause Total Internal Reflections of the light incident upon the trench structure 150.

In some embodiments, whether that of FIG. 3A or any comprising a trench structure 150, the trench structure 150 may be provided with a liner 156 surrounding all or part of the trench structure 150. The liner 156 may vertically extend over the entire portion of the trench which is located laterally relative to the substrate doping region 116.

The liner 156 may extend from the p-doping region 110-1. Alternatively, the liner 156 may extend into the p-doping region 110-1.

The liner 156 acts as an outer boundary for the corresponding region of the trench. The liner 156 may encapsulate the trench structure 150 in the region in which the liner 156 is present. Alternatively, the liner 156 may only border some of the sides of the trench structure 150.

The liner 156 is for instance configured to act as a pinning layer.

The liner 156 is made of p-doped material. The liner 156 may be made of the same material of the p-doping region 110-1, or a different material.

The liner 156 may be grown epitaxially, may be formed by out-diffusion (e.g. from an oxide or gas initially arranged in the trench), or by implantation.

In the following, a number of different possible implementations of the time of flight sensor device 100 having the trench structure 150 are exemplarily described. The different configurations, in particular in terms of structure and geometry of the trench structure 150, described in reference to FIG. 3A apply to these implementations.

In the present description of embodiments, the same or similar elements having the same structure and/or function are provided with the same reference numbers or the same name, wherein a detailed description of such elements will not be repeated for every embodiment. Thus, the above description with respect to FIG. 3A is equally applicable to the further embodiments as described below. In the following description, essentially the differences, e.g. additional elements, to the embodiment as shown in FIG. 3A and the technical effect(s) resulting therefrom are discussed in detail.

Figure 3B:
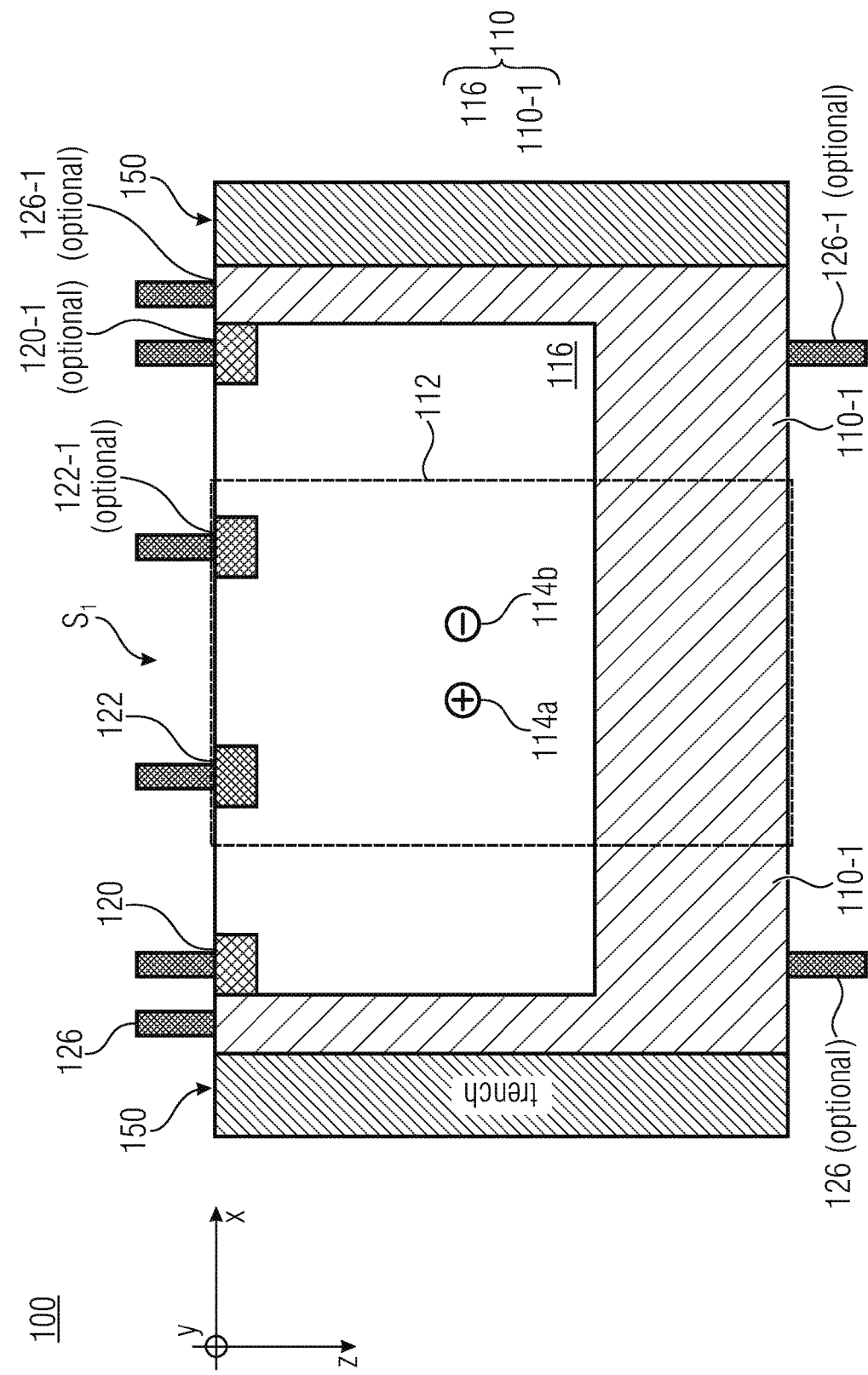

FIG. 3B shows a schematic cross view of a time of flight sensor device according to a further embodiment.

As shown in FIG. 3B, the trench structure 150 is laterally spaced from the substrate doping region 116, i.e. from the lateral side face 116-A of the substrate doping region 116, wherein at least a part of the p-doped region 110-1 of the semiconductor substrate 110 extends between the substrate doping region 116 and the trench structure 150.

As shown in FIG. 3B, the trench structure 150 is laterally spaced from the substrate doping region 116 by means of the p-doped semiconductor region 110-1 of the semiconductor substrate, i.e., the trench structure 150 and the substrate doping region 116 are not directly adjacent. Based on this implementation, a crosstalk between neighboring sensor cells of the time of flight sensor device 100 may be suppressed or at least reduced. Furthermore, the distribution of the electrical potential within the substrate doping region 116 may be improved for providing a fast charge carrier transport to the at least one readout node 120, 120-1.

As shown in FIG. 3B, the at least one substrate contact 126, 126-1 may be arranged at the first main surface region 110-A (front side) or at the second main surface region 110-B (back side) of the semiconductor substrate 110 in electrical contact with the p-doped region 110-1 of the semiconductor substrate 110.

One notes that the embodiment of FIG. 3B can be seen as an embodiment of FIG. 3A in which the trench structure 150 borders the device 100 at least in part and wherein the liner 156 is only present next to an internal surface of the trench structure 150 and is made of the same material as the region 110-1.

Figure 3C:
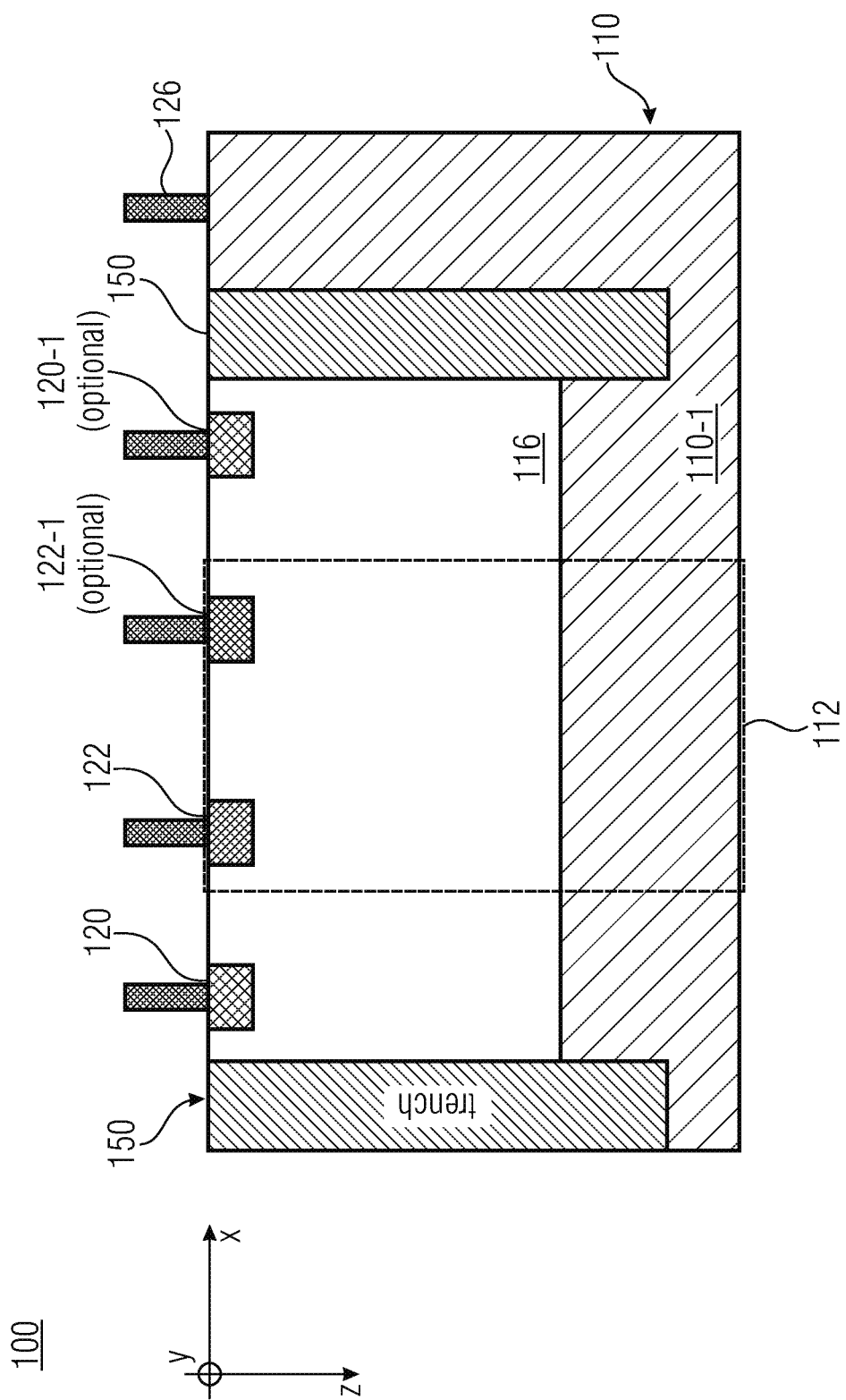

FIG. 3C shows a schematic cross sectional view of the time of flight sensor device 100 according to a further embodiment.

The arrangement of the time of flight sensor device 100 of FIG. 3C differs from the arrangement of the time of flight sensor device 100 of FIG. 3A or FIG. 3B in that the p-doped region 110-1 of the semiconductor substrate 110 extends below the trench structure 150 in a direction laterally beyond the trench structure 150 and further vertically to the first main surface region 110-A of the semiconductor substrate to provide a continuous p-doped region 110-1 of the semiconductor substrate. Thus, the p-doped region 110-1 of the semiconductor substrate 110 extends from the main surface region 110-A (from an opposing side of the trench structure 150 with respect to the substrate doping region 116) vertically into the semiconductor substrate 110 and, below the trench structure 150, laterally to the region of the semiconductor substrate 110 vertically below the substrate doping region 116.

Thus, the at least one substrate contact 126 may be arranged at the first main surface region 110-A (front side) of the semiconductor substrate 110 so that no back side processing of the semiconductor substrate (=wafer) 110 is required for providing the at least one substrate contact 126 during manufacturing of the optical time of flight sensor device 100.

In some embodiments, the semiconductor substrate 110 may only extend below the trench structure(s), i.e. not laterally beyond the later.

Figure 3D:
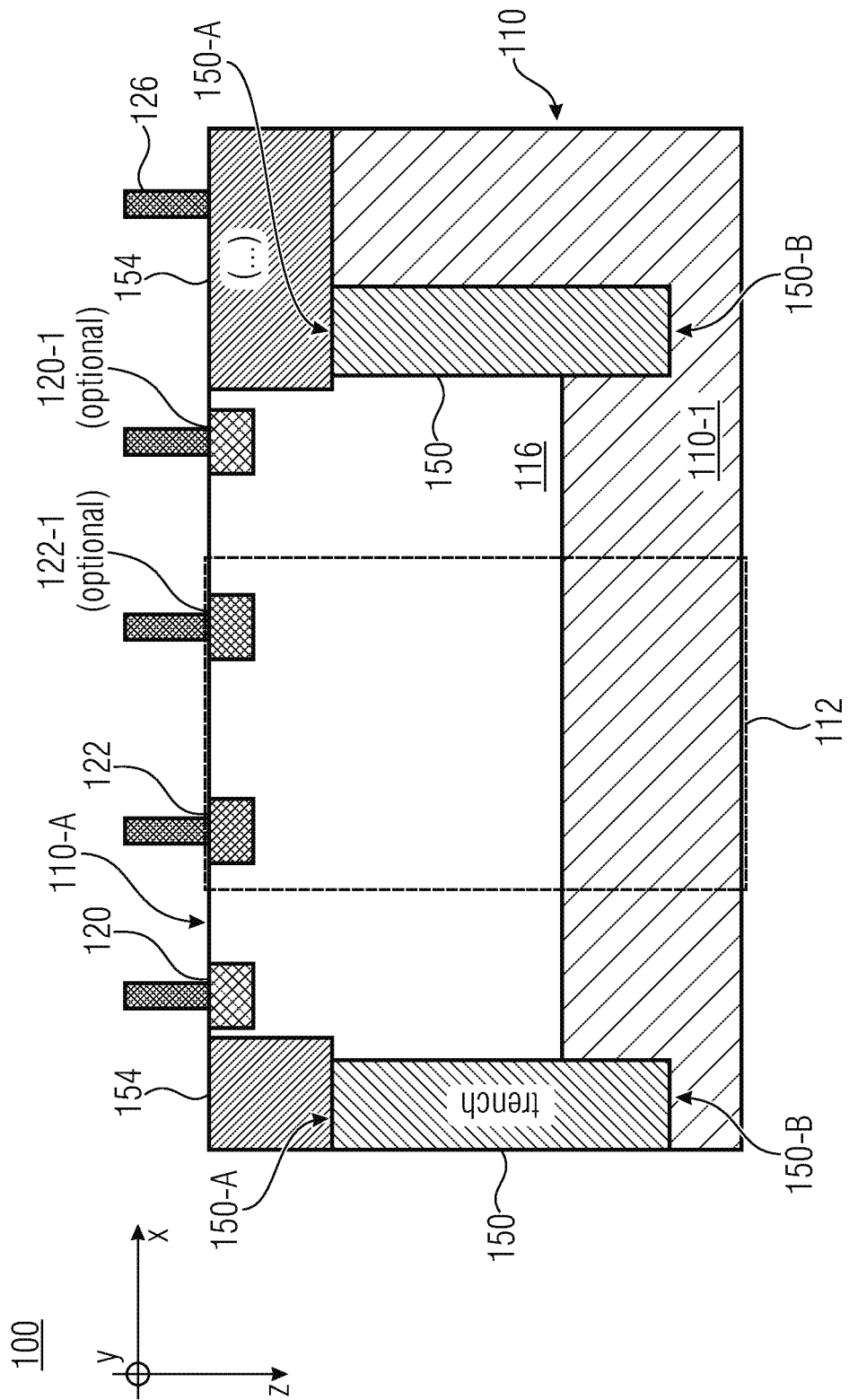

FIG. 3D shows a schematic cross sectional view of the time of flight sensor device 100 according to a further embodiment.

As shown in FIG. 3D, the trench structure 150 is buried in the semiconductor substrate 110. To be more specific, the first main surface region 150-A (e.g. top end) of the trench structure 150 is offset from the first main surface region 110-A in the depth direction of the semiconductor substrate 110. In the depth direction, the second main surface region 150-B (e.g. bottom end) of the trench structure 150 reaches the p-doped region 110-1 of the semiconductor substrate. Thus, the second main surface region 150-b of the trench structure contacts the p-doped region 110-1 of the semiconductor substrate 110.

As shown in FIG. 3D, a p-doped substrate contact region 154 is arranged in the semiconductor substrate 110, this substrate contact region 154 having a higher doping concentration than the p-doped region 110-1. The substrate contact region 154 is arranged adjacent to the first main surface region 110-A of the semiconductor substrate 110. The substrate contact region 154 may extend at least between the first main surface region 110-A of the semiconductor substrate and the first main surface region 150-A of the buried trench structure 150. Moreover, the upper portion of the substrate doping region 116 laterally extends between the substrate contact region 154. Thus, the substrate doping region 116 is laterally confined between (the opposing portions of) the substrate contact region 154 and the vertically following trench structure 150.

The p-doped substrate contact region 154 may comprise a p-type doping concentration in the range between 1E14 atoms/cm$^3$ and 1E20 atoms/cm$^3$, or between 1E16 atoms/cm$^3$ and 1E19 atoms/cm$^3$, for example.

The implementation of the time of flight sensor device 100 according to embodiment of FIG. 3D provides more area on the surface 110-A of the semiconductor substrate 110 which is available for (optional) active devices (not shown in FIG. 3D).

Figure 3E:
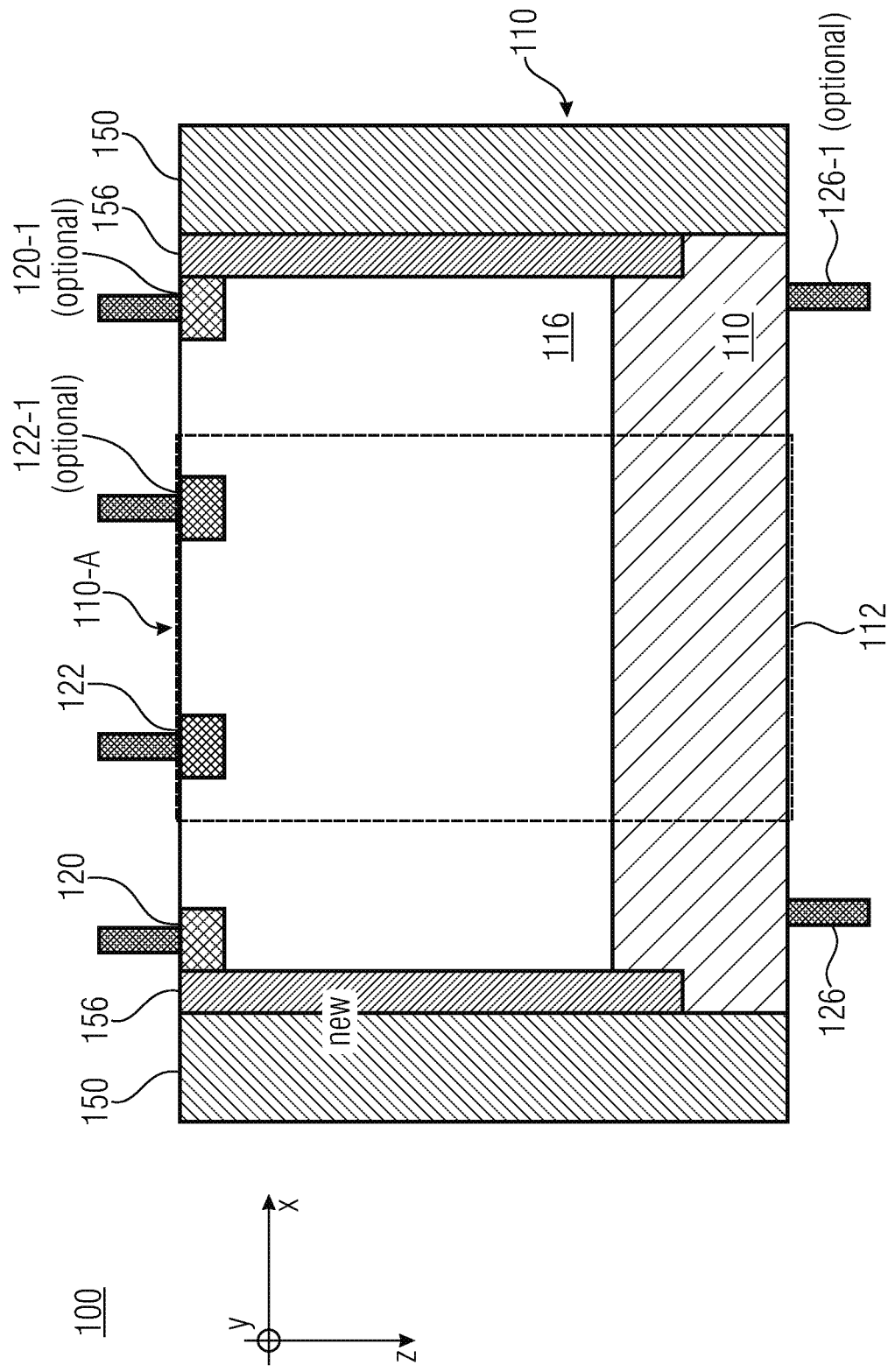

FIG. 3E shows a schematic cross sectional view of the time of flight sensor device according to a further embodiment.

As shown in FIG. 3E, the time of flight sensor device 100 additionally comprises, as described in reference to the arrangement of FIG. 3A, a vertical liner 156 forming a resistive pinning layer 156 in form of a p-doped resistive region of the semiconductor substrate 110 which is laterally arranged at least between the substrate doping region 116 and the trench structure 150. The resistive pinning layer 156 may be arranged between the first main surface region 110-A of the semiconductor substrate 110 and the p-doped region 110-1 of the semiconductor substrate 110. Thus, the resistive pinning layer 156, which at least partially or completely laterally surrounds or encloses the substrate doping region 116, may extend from the first main surface region 110-A to the p-doped region 110-1 of the semiconductor substrate 110.

The doping concentration of the pinning layer 156 is greater than 1E14 atoms/cm$^3$, or between 1E14 atoms/cm$^3$ and 1E18 atoms/cm$^3$, or between 1E15 atoms/cm$^3$ and 1E17 atoms/cm$^3$, or between 5E15 atoms/cm$^3$ and 5E16 atoms/cm$^3$, for example and, thus, it is higher than the doping concentration of the p-doped region 110-1 of the semiconductor substrate 110.

Based on the pinning layer 156, the leakage (shot noise) from electron/hole pair generation, at the interface (e.g., SI/SIO2 interface) between the semiconductor material of the semiconductor substrate 110 and the isolating (e.g., dielectric) material of the trench structure 150 may be suppressed or at least reduced.

One notes that the embodiment of FIG. 3E may be seen as an embodiment of FIG. 3A in which the liner 156 extends into the region 110-1 and is made of a different material relative to the latter, and is only present next to the internal face of the trench structure 150.

Figure 3F:
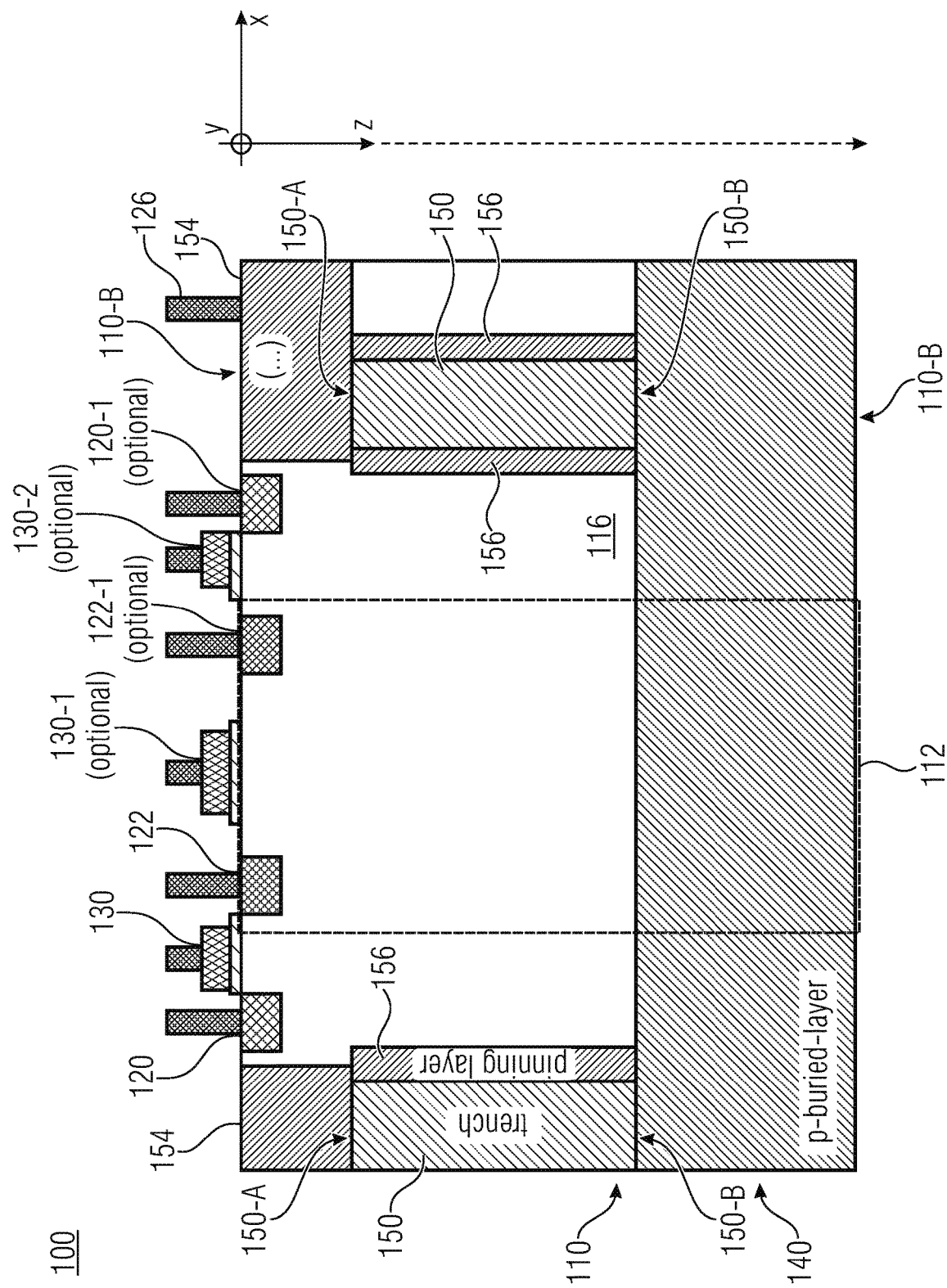

FIG. 3F shows a schematic cross sectional view of the time of flight sensor device 100 according to a further embodiment.

The time of flight sensor device as shown in FIG. 3F may be implemented as described with respect to FIGS. 3A-E, so that the above description with respect to FIG. 3A-E is equally applicable to the embodiment as described below.

As shown in FIG. 3F, the time of flight sensor device 100 comprises the trench structure 150 (as described with respect to FIG. 3D) which is buried in the semiconductor substrate 110. To be more specific, the first main surface region 150-1 of the trench structure 150 is offset from the first main surface region 110-A in the depth direction of the semiconductor substrate 110. In the depth direction, the second main surface region 150-B of the trench structure 150 reaches the p-doped region 110-1 of the semiconductor substrate. Thus, the second main surface region 150-B of the trench structure contacts the p-doped region 110-1 of the semiconductor substrate 110. As further shown in FIG. 3F, the p-doped substrate contact region 154 is arranged in the semiconductor substrate 110 adjacent to the first main surface region 110-A. The substrate contact region 154 may extend between the first main surface region 110-A of the semiconductor substrate and the first main surface region 150-A of the buried trench structure 150.

As shown in FIG. 3F, the time of flight sensor device 100 further comprises the pinning layer 156 (as described with respect e.g. to FIG. 3E) in form of a p-doped resistive region of the semiconductor substrate 110 which is laterally arranged at least between the substrate doping region 116 and the trench structure 150.

As shown in FIG. 3F, the time of flight sensor device 100 further comprises the buried doping later 140 (as described with respect to FIG. 2A-B) which is arranged in the semiconductor substrate vertically (in the z-direction) below the substrate doping region 116 and the p-doped region 110-1 of the semiconductor substrate 110. The buried doping layer 140 may, for example, extend to the second main surface region 110-B of the semiconductor substrate 110. The buried doping layer 140 may be a part of the p-doped region 110-1 of the semiconductor substrate 110. The buried doping layer 140 has a higher p-type doping concentration than the p-doped region 110-1 of the semiconductor substrate 110 adjacent to the substrate doping region 116.

According to a further embodiment (not shown in FIG. 2A) the buried doping layer 140 may be arranged in the semiconductor substrate 110 in the z-direction directly adjacent to the substrate doping region 116 in the semiconductor substrate 110. Thus, the buried doping layer 140 may form the p-doped region 110-1 of the semiconductor substrate 110.

As shown in FIG. 3F, the time of flight sensor device 100 further comprises the sensor electrode 130, e.g. a so-called separation gate or photogate (modulation gate), (as described with respect to FIG. 1B) which is optionally separated by an isolating material 132 form the semiconductor substrate 110 and may be arranged on the first main surface region 110-A of the semiconductor substrate 110. As shown in FIG. 3F, the sensor electrode 130 may be arranged in a lateral direction between the control electrode 122 and the readout node 120. Moreover, the further sensor electrode 130-1 may be optionally provided on the first main surface region 110-A of the semiconductor substrate 110 in combination with the further control electrode 122-1. Moreover, the further sensor electrode(s) 130-2, . . . , may be provided on the first main surface region 110-A of the semiconductor substrate 110 for redirecting the photo-generated charge carriers to respective readout node 120, 120-1.

Based on the implementation of the time of flight sensor device 100 according FIG. 3F, a very efficient demodulation of the photo-generated charge carriers in the conversion region 112 is achieved.

Figure 3G:
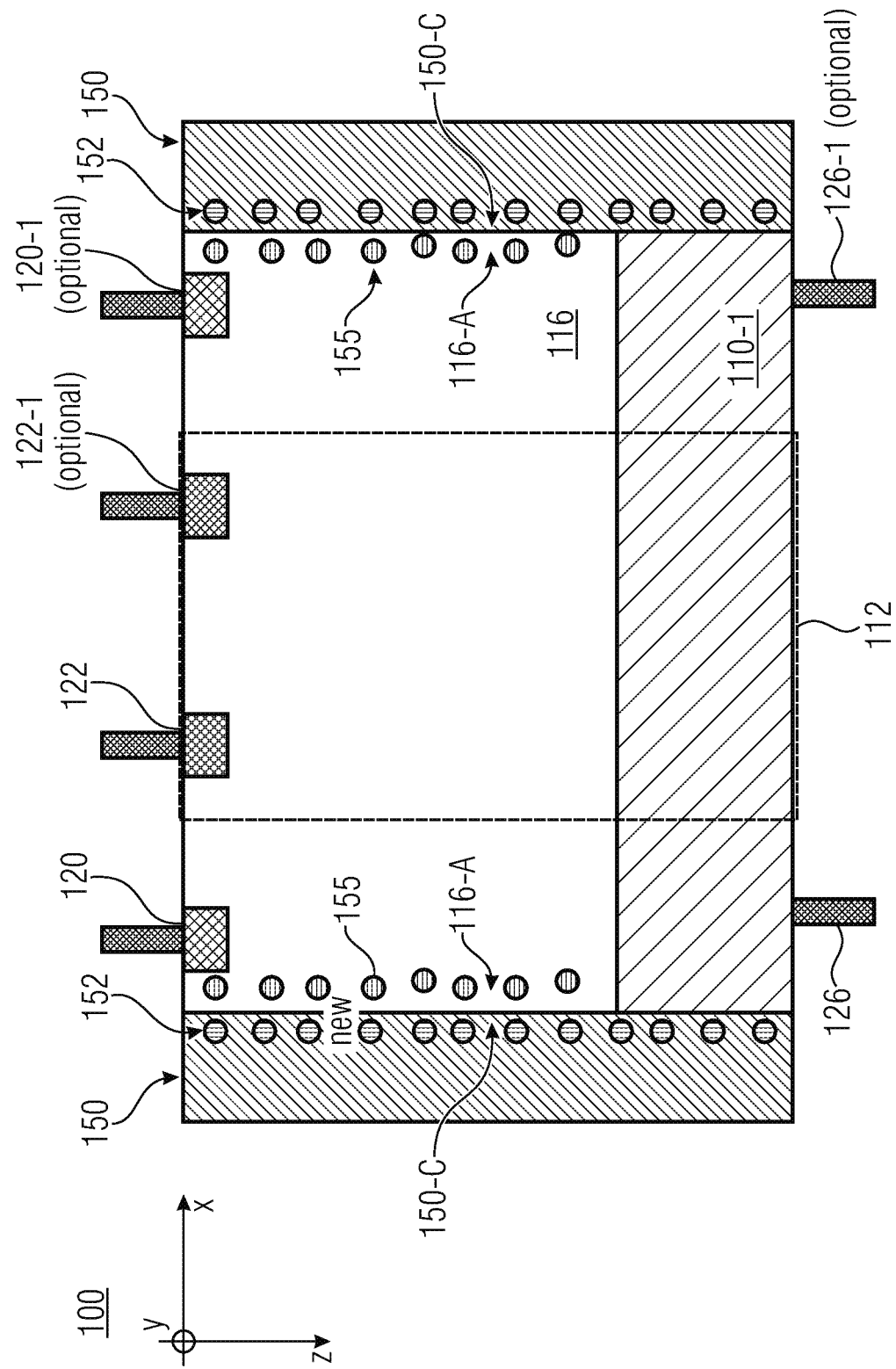

FIG. 3G shows a schematic cross sectional view of the time of flight sensor device 100 according to a further embodiment.

As shown in FIG. 3G (when compared to the implementation of FIG. 3A), the trench material filling the trench structure 150 comprises charges 152 (negative charge carriers or negatively charged regions) neighboring the lateral main surface region 150-C of the trench structure 150. The dielectric trench filling material may comprise, for example, $AL_2O_3$, wherein the $AL_2O_3$ material may comprise a layer-like structure. The negative charge carriers 152 may attract positive charge carries (holes) 155 from the substrate material of the semiconductor substrate 110 at the lateral region 116-A of the substrate doping region 116. More precisely, negative charges 152 are stored in the dielectric material of the trench structure 150 which leads to an accumulation of holes 155 at the lateral region 116-A of the substrate doping region 116 bordering to the trench structure 150.

The accumulation of holes 155 at the lateral region 116-A of the substrate doping region 116 influences the electrical equipotential lines in the substrate doping region 116 which results in a more efficient demodulation of the photo-generated charge carriers 114b. Furthermore, the leakage (shot noise) from an electron/hole pair generation at the interface between the semiconductor material of the semiconductor substrate 110 and the dielectric material of the trench structure 150 may be suppressed or at least reduced. These results are achievable with a minimum space requirement based on the implementation of the time of flight sensor device 100 according to the embodiment of FIG. 3G.

Figure 3H:
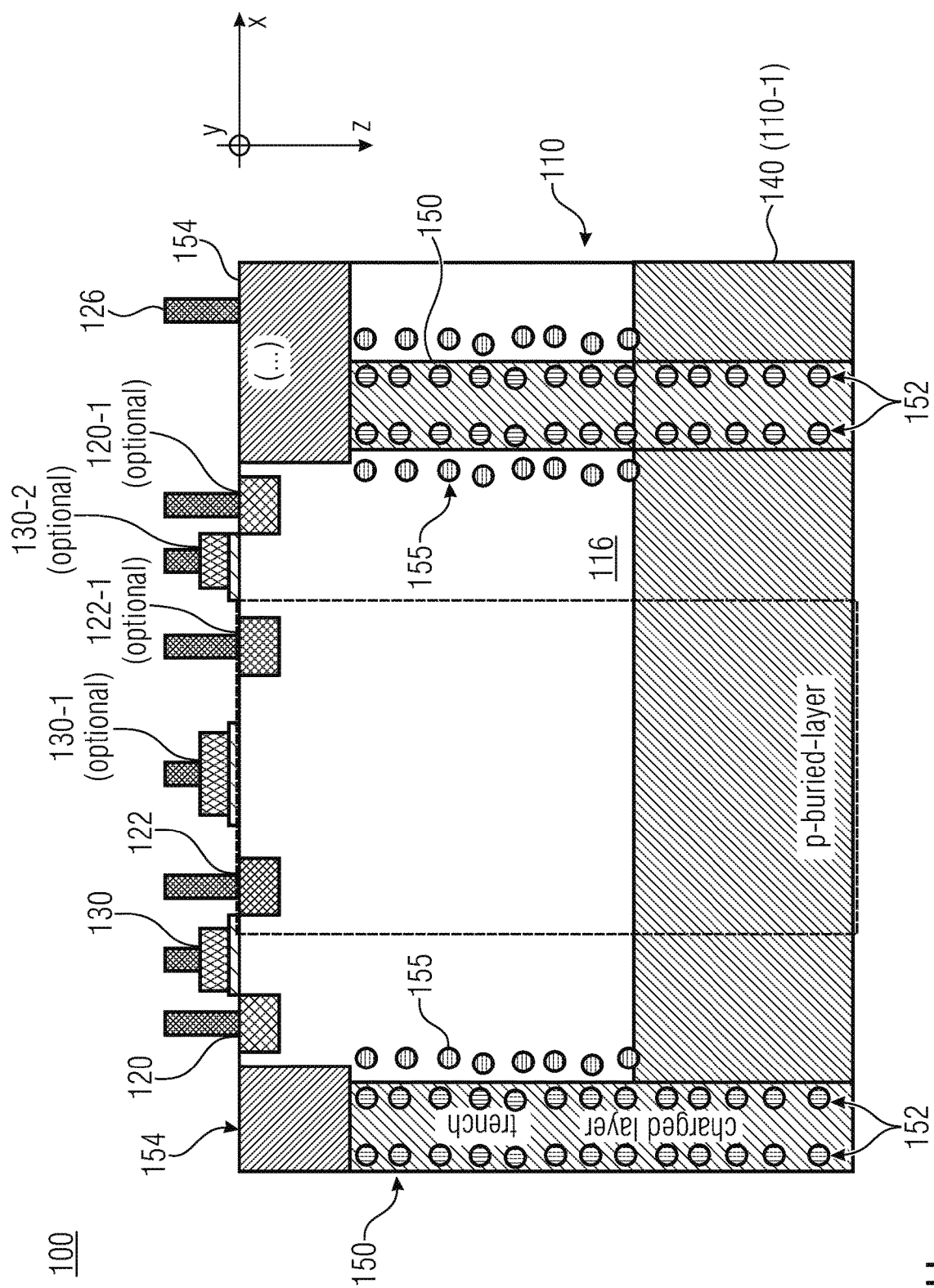

FIG. 3H shows a schematic cross sectional view of the time of flight sensor device 100 according to a further embodiment.

The arrangement of the time of flight sensor device 100 of FIG. 3H differs from the arrangement of the time of flight sensor device 100 of FIG. 3F in that, instead of the pinning layer 156, the trench material filling the trench structure 150 comprises charges 152 (negative charge carriers or negatively charged regions) neighboring to the lateral main surface region 150-C of the trench structure 150.

As shown in FIG. 3H, the time of flight sensor device 100 comprises the trench structure 150 which is buried in the semiconductor substrate 110.

The time of flight sensor device 100 further comprises the buried doping later 140 which is arranged in the semiconductor substrate vertically (in the z-direction) below the substrate doping region 116 and the p-doped region 110-1 of the semiconductor substrate 110.

Moreover, the at least one additional sensor electrode(s) 130, 130-1, 130-2, . . . , e.g. a so-called separation gate or photogate (modulation gate), may be provided on the first main surface region 110-A of the semiconductor substrate 110 for redirecting the photo-generated charge carriers to respective readout node 120, 120-1.

Based on the implementation of the time of flight sensor device 100 according FIG. 3F, a very efficient demodulation of the photo-generated charge carriers in the conversion region 112 is achieved.

As exemplarily shown in FIG. 3A-H, the control electrode(s) 122, 122-1 of the time of flight sensor device 100 may arranged in the substrate doping region 116 of the semiconductor substrate 110 and may have the p doping type, e.g. as an implanted p doping region in the semiconductor substrate 110. Thus, the control electrode(s) 122, 122-1 of the time of flight sensor device 300 may correspond to the control electrode(s) 122, 122-1 of the time of flight sensor device 100 (e.g. as described with respect to FIGS. 1A-C).

Alternatively, the control electrode(s) 122, 122-1 of the time of flight sensor device 100 may be arranged on the substrate doping region 116 of the semiconductor substrate 110 and may be separated by an insulating material 123 from the semiconductor substrate, e.g. in form of a metallization or polysilicon region 122, 122-1 with an intermediate insulator layer 123 on the main surface region 110-A of the semiconductor substrate 110

Figure 4:
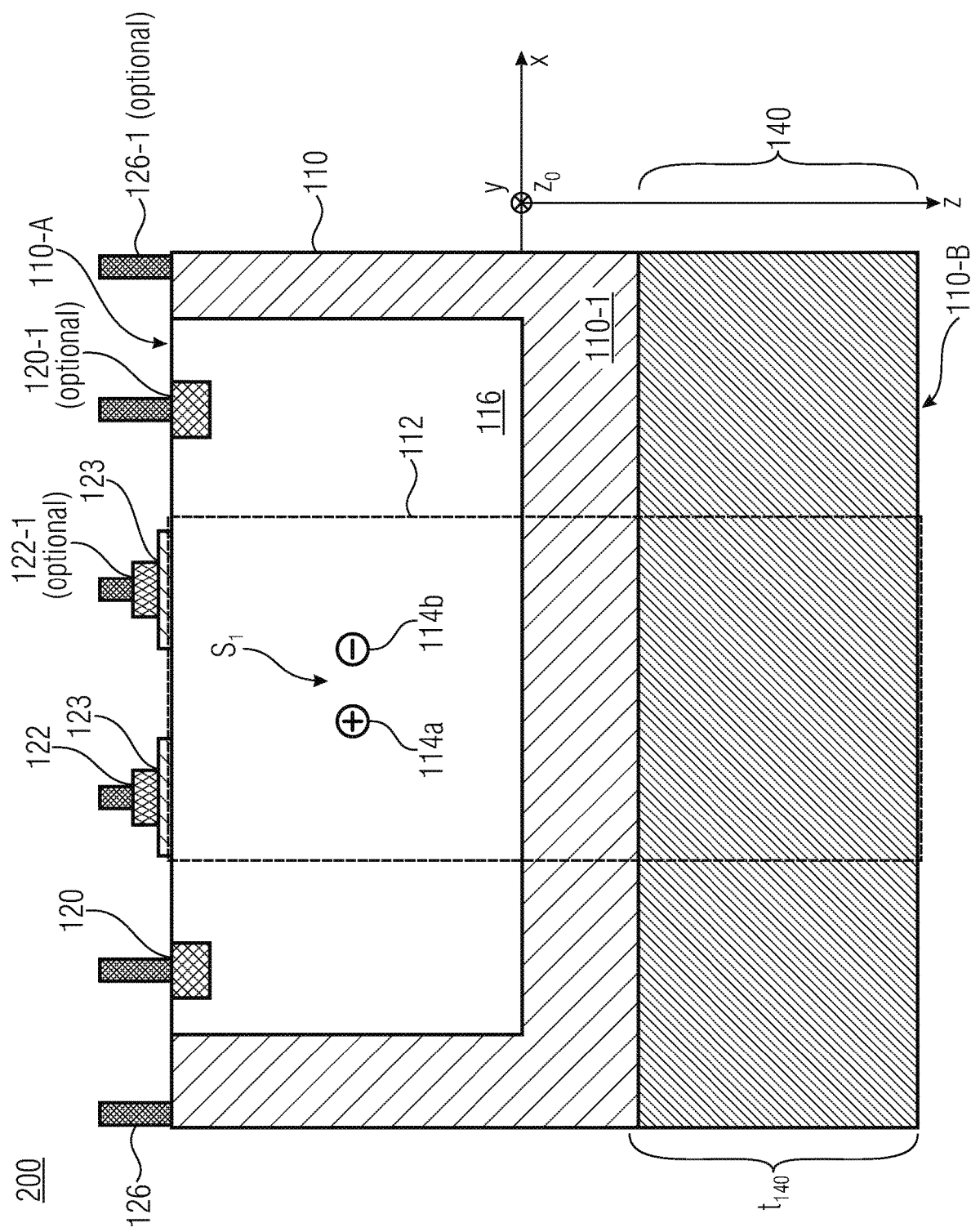
FIG. 4 shows a schematic cross sectional view of the time of flight sensor device according to a further embodiment.

FIG. 4 shows a schematic cross sectional view of the time of flight sensor device 200 according to a further embodiment.

According to another embodiment, a time of flight sensor device 200 comprises a semiconductor substrate 110. The semiconductor substrate 110 comprises a conversion region 112 to convert an electromagnetic signal $S_1$ into photo-generated charge carriers 114a, 114b. The semiconductor substrate 110 further comprises a substrate doping region 116 having a n doping type, wherein the substrate doping region 116 extends from a first main surface region 110-A of the semiconductor substrate 110 into the semiconductor substrate 110 (in the depth direction or z direction).

The semiconductor substrate 110 has adjacent to the substrate doping region 116 a p-doped region 110-1, i.e. the remaining region 110-1 of the semiconductor substrate 110-1 adjacent to the substrate doping region 116 has a p-doping type. The substrate doping region 116 at least partially forms the conversion region 112 in the semiconductor substrate. A readout node 120 is arranged in the semiconductor substrate 110 within the substrate doping region 116 and has the n doping type e.g. with a higher doping concentration than the substrate doping region 116. The readout node 120 is configured to readout the photo generated charge carriers 114b, e.g., the photo-generated electrons.

A control electrode 122 is arranged in or on the substrate doping region of the semiconductor substrate. A buried doping layer 140 in the semiconductor substrate having a higher concentration of the p doping type than p-doped region 110-1 of the semiconductor substrate 110 is arranged adjacent to the substrate doping region 116, wherein the buried doping layer 140 is formed in the semiconductor substrate 110 and vertically below the substrate doping region 116 in the semiconductor substrate 110.

As exemplarily shown in FIG. 4, the control electrode(s) 122, 122-1 of the time of flight sensor device 200 may be arranged on the substrate doping region 116 of the semiconductor substrate 110 and may be separated by an insulating material 123 from the semiconductor substrate 110, e.g. in form of a metallization or polysilicon region 122, 122-1 with an intermediate insulator layer 123 on the main surface region 110-A of the semiconductor substrate 110.

Alternatively, the control electrode(s) 122, 122-1 may arranged in the substrate doping region 116 of the semiconductor substrate 110 and may have the p doping type, e.g. as an implanted p doping region in the semiconductor substrate 110. Thus, the control electrode(s) 122, 122-1 may correspond to the control electrode(s) 122, 122-1 of the time of flight sensor device 100 (e.g. as described with respect to FIGS. 1A-C and FIGS. 2A-B).

According to an embodiment, the buried doping layer 140 of the time of flight sensor device 200 of FIG. 4 structurally and functionally corresponds to the buried doping layer 140 of the time of flight sensor device 100 of FIG. 2A-B, wherein the doping concentration of the buried doping layer 140 of FIG. 4 is exemplarily shown in FIG. 2B as a schematic plot having the two exemplary alternatives I, II of the doping profile $D_{140}$ of the buried semiconductor layer 140 in the depth direction (=z-direction) of the semiconductor substrate 110. Thus, the above description of the structure and functionality of the buried doping layer 140 of the time of flight sensor device 100 (e.g. with respect to FIG. 2A-B) is equally applicable to the embodiment of the time of flight sensor device 200 as described with respect to FIG. 4.

According to a further embodiment, the time of flight sensor device 200 may comprise a trench structure (not shown in FIG. 4) which is arranged laterally with respect to the substrate doping region 116 and extends vertically with respect to the first main surface region 110-A of the semiconductor substrate 110 into the semiconductor substrate 110. Thus, the above description of the structure and functionality of the trench structure 150 of the time of flight sensor device 100 (e.g. with respect to FIG. 3A-H) is equally applicable to the embodiment of the time of flight sensor device 200 as described with respect to FIG. 4.

According to an embodiment, the TOF sensor device 100 may optionally comprise a further control electrode 122-1 to optionally provide a pair of control electrodes 122, 122-1 and a further readout node 120-1 to optionally provide a pair of readout nodes 120, 120-1.

The optional further control electrode 122-1 may be also arranged in or on the substrate doping region 116 of the semiconductor substrate 110. As shown in FIG. 4, the further control electrode 122-1 may also be arranged in the conversion region 112 adjacent to the first main surface region 110-A of the semiconductor substrate 110. The further control electrode 122-1 may be formed as implanted doping region in the semiconductor substrate 110. The further control electrode 122-1 may comprise the same p-type doping concentration as the control electrode 122, for example.

Alternatively, the further control electrode 122-1 may be arranged on the substrate doping region 116 of the semiconductor substrate 110 and is separated by an insulating material 123 from the semiconductor substrate, e.g. in form of a metallization or polysilicon region 122-1 with an intermediate insulator layer 123 on the main surface region 110-A of the semiconductor substrate 110.

The optional further readout node 120-1 is arranged in the semiconductor substrate 110 within the substrate doping region 116 and has the n-doping type, e.g. with a higher doping concentration than the substrate doping region 116. The further readout node 120-1 is also configured to readout the photo-generated charge carries 114b, e.g., the photo-generated electrons. The further readout node 120-1 may be formed as further implanted doping region in the semiconductor substrate 110. The further readout node 120-1 may comprise the same n-type doping concentration as the readout node 120.

Thus, the above description of the structure and functionality of the further readout node 120-1 and the further control electrode 122-1 of the time of flight sensor device 100 (e.g. with respect to FIG. 1A-B) is equally applicable to the embodiment of the time of flight sensor device 200 as described with respect to FIG. 4.

As shown in FIG. 4, a further substrate contact 126-1 may be optionally provided at the p-doped region 110-1 of the semiconductor substrate 110. In case, the further substrate contact 126-1 is arranged, the above description of the structure and functionality of the substrate contact 126-1 of the time of flight sensor device 100 is equally applicable to the further substrate contact 126-1 of the time of flight sensor device 100.

Figure 5A:
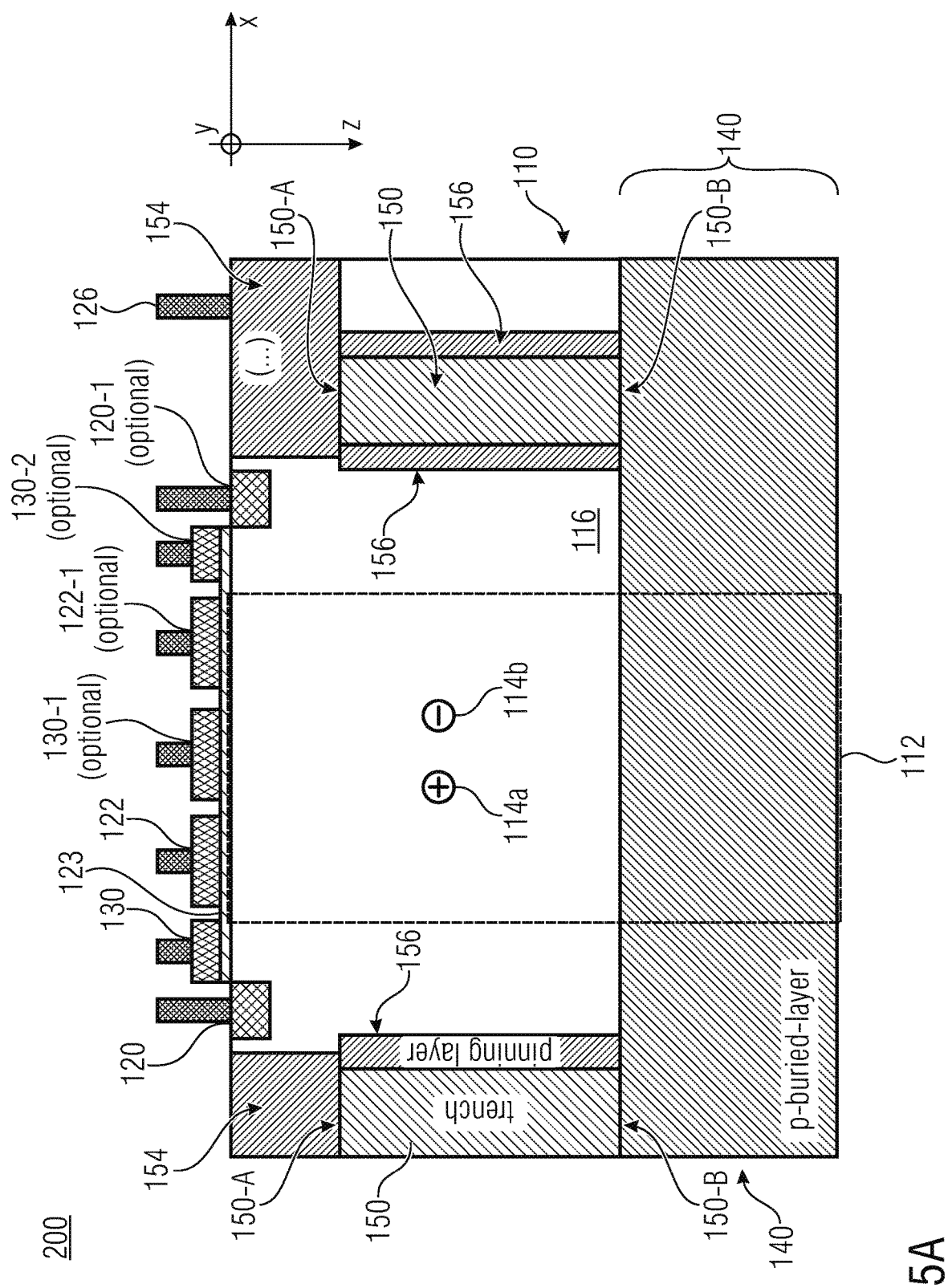
FIGS. 5A-5B show schematic cross sectional views of the time of flight sensor device according to further embodiments.
Figure 5B:
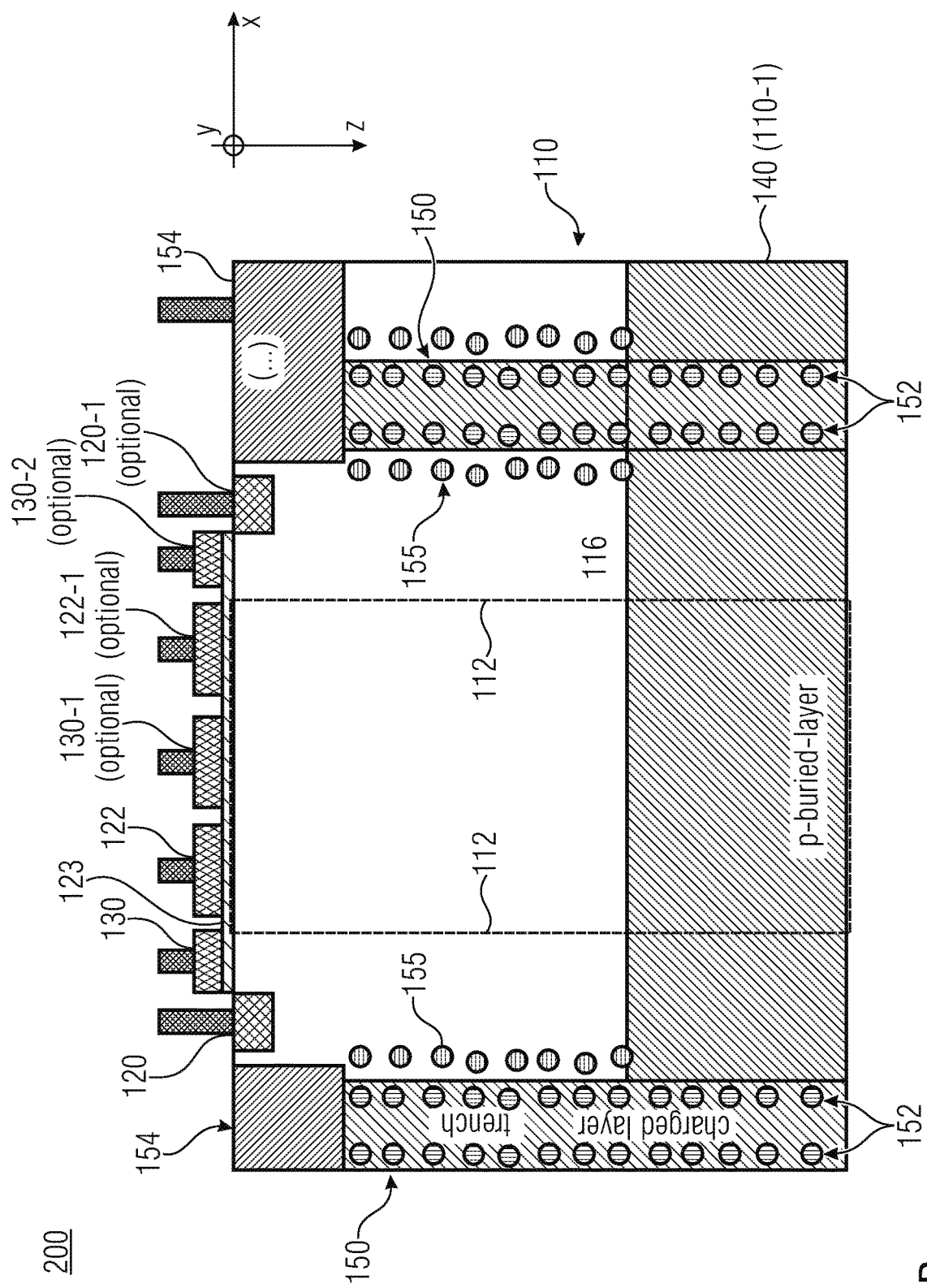

FIGS. 5A-B show schematic cross sectional views of the time of flight sensor device according to further embodiments.

The time of flight sensor device 200 as shown in FIG. 5A may be implemented as described with respect to FIG. 4 wherein the time of flight sensor device 200 may further comprise a trench structure 150 in the semiconductor substrate 110 which is arranged laterally with respect to the substrate doping region 116 and extends vertically with respect to the first main surface region 110-A of the semiconductor substrate 110 into the semiconductor substrate 110. The trench structure 150 may be buried in the semiconductor substrate 110 Thus, the above description of the structure and functionality of the trench structure 150 of the time of flight sensor device 100 (e.g. with respect to FIG. 3A-H) is equally applicable to the embodiment of the time of flight sensor device 200 as described with respect to FIG. 4.

As exemplarily shown in FIG. 5A, the control electrode(s) 122, 122-1 of the time of flight sensor device 200 may be arranged on the substrate doping region 116 of the semiconductor substrate 110 and may be separated by an insulating material 123 from the semiconductor substrate, e.g. in form of a metallization or polysilicon region 122, 122-1 with an intermediate insulator layer 123 on the main surface region 110-A of the semiconductor substrate 110. Alternatively, the control electrode(s) 122 may arranged in the substrate doping region 116 of the semiconductor substrate 110 and may have the p doping type, e.g. as an implanted p doping region in the semiconductor substrate 110. Thus, the control electrode(s) 122, 122-1 of the time of flight sensor device 200 may correspond to the control electrode(s) 122, 122-1 of the time of flight sensor device 100 (e.g. as described with respect to FIGS. 1A-C and FIGS. 2A-B).

As shown in FIG. 5A, the trench structure 150 is buried in the semiconductor substrate 110, wherein the p-doped substrate contact region 154 is arranged in the semiconductor substrate 110 adjacent to the first main surface region 110-A of the semiconductor substrate 110 and extends at least between the first main surface region 110-A of the semiconductor substrate and the first main surface region 150-A of the buried trench structure 150. The second main surface region 150-b of the trench structure contacts the p-doped region 110-1 of the semiconductor substrate 110.

As shown in FIG. 5A, the time of flight sensor device 200 may further comprise the pinning layer 156 in form of a p-doped resistive region of the semiconductor substrate 110 which is laterally arranged between the substrate doping region 116 and the trench structure 150. The time of flight sensor device 200 may further comprise the buried doping later 140 which is arranged in the semiconductor substrate vertically below the substrate doping region 116 of the semiconductor substrate 110. The buried doping layer 140 may be a part of the p-doped region 110-1 of the semiconductor substrate 110. The buried doping layer 140 has a higher p-type doping concentration than the p-doped region 110-1 of the semiconductor substrate 110 adjacent to the substrate doping region 116.

As shown in FIG. 5A, the time of flight sensor device 200 further comprises the sensor electrode 130, e.g. a so-called separation gate or photogate (modulation gate), (as described with respect to FIG. 1B) which is optionally separated by an isolating material 132 form the semiconductor substrate 110 and may be arranged on the first main surface region 110-A of the semiconductor substrate 110. As shown in FIG. 5A, the sensor electrode 130 may be arranged in a lateral direction between the control electrode 122 and the readout node 120. Moreover, the further sensor electrode 130-1 may be optionally provided on the first main surface region 110-A of the semiconductor substrate 110 in combination with the further control electrode 122-1. Moreover, the further sensor electrode(s) 130-2, . . . , may be provided on the first main surface region 110-A of the semiconductor substrate 110 for redirecting the photo-generated charge carriers to respective readout node 120, 120-1.

Based on the implementation of the time of flight sensor device 200 according FIG. 5A, a very efficient demodulation of the photo-generated charge carriers in the conversion region 112 is achieved.

FIG. 5B shows a schematic cross sectional view of the time of flight sensor device 200 according to a further embodiment. The arrangement of the time of flight sensor device 200 of FIG. 5B differs from the arrangement of the time of flight sensor device 200 of FIG. 5A in that, instead of the pinning layer 156, the trench material filling the trench structure 150 comprises charges 152 (negative charge carriers or negatively charged regions) neighboring to the lateral main surface region 150-C of the trench structure 150. Thus, the above description of the structure and functionality of the trench structure 150 of the time of flight sensor device 100 (e.g. with respect to FIG. 3H) is equally applicable to the embodiment of the time of flight sensor device 200 as described with respect to FIG. 5B.

As shown in FIG. 5B, the time of flight sensor device 200 comprises the trench structure 150 which is buried in the semiconductor substrate 110. The time of flight sensor device 200 further comprises the buried doping later 140 which is arranged in the semiconductor substrate vertically (in the z-direction) below the substrate doping region 116 and the p-doped region 110-1 of the semiconductor substrate 110.

As exemplarily shown in FIG. 5B, the control electrode(s) 122, 122-1 of the time of flight sensor device 200 may be arranged on the substrate doping region 116 of the semiconductor substrate 110 and may be separated by an insulating material 123 from the semiconductor substrate, e.g. in form of a metallization or polysilicon region 122, 122-1 with an intermediate insulator layer 123 on the main surface region 110-A of the semiconductor substrate 110. Alternatively, the control electrode(s) 122, 122-1 may arranged in the substrate doping region 116 of the semiconductor substrate 110 and may have the p doping type, e.g. as an implanted p doping region in the semiconductor substrate 110. Thus, the control electrode(s) 122, 122-1 may correspond to the control electrode(s) 122, 122-1 of the time of flight sensor device 100 (e.g. as described with respect to FIGS. 1A-C and FIGS. 2A-B).

Moreover, the at least one additional sensor electrode(s) 130, 130-1, 130-2, . . . , e.g. a so-called separation gate or photogate (modulation gate), may be provided on the first main surface region 110-A of the semiconductor substrate 110 for redirecting the photo-generated charge carriers to respective readout node 120, 120-1.

FIG. 6 shows a schematic cross sectional view of a time of flight sensor device 300 according to further embodiments.

According to another embodiment, the time of flight sensor device 300 comprises a semiconductor substrate 110. The semiconductor substrate 110 comprises a conversion region 112 to convert an electromagnetic signal $S_1$ into photo-generated charge carriers 114a, 114b. The semiconductor substrate 110 further comprises a substrate doping region 116 having a n doping type, wherein the substrate doping region 116 extends from a first main surface region 110-A of the semiconductor substrate 110 into the semiconductor substrate 110 (in the depth direction or z direction).

The semiconductor substrate 110 has adjacent to the substrate doping region 116 a p-doped region 110-1, i.e. the remaining region 110-1 of the semiconductor substrate 110-1 adjacent to the substrate doping region 116 has a p-doping type. The substrate doping region 116 at least partially forms the conversion region 112 in the semiconductor substrate.

A readout node 120 is arranged in the semiconductor substrate 110 within the substrate doping region 116 and has the n doping type e.g. with a higher doping concentration than the substrate doping region 116. The readout node 120 is configured to readout the photo generated charge carriers 114b, e.g., the photo-generated electrons.

A control electrode 122 is arranged in or on the substrate doping region of the semiconductor substrate.

The time of flight sensor device 300 further comprises a trench structure 150 in the semiconductor substrate 110 which is arranged laterally with respect to the substrate doping region 116 and extends vertically with respect to the first main surface region 110-A of the semiconductor substrate 110 into the semiconductor substrate 110.

Thus, the above description of the different implementations of the time of flight sensor device 100 regarding the structure and functionality of the trench structure 150 (e.g. with respect to FIG. 3A-H) is equally applicable to the time of flight sensor device 300 as described with respect to FIG. 6.

As exemplarily shown in FIG. 6, the control electrode(s) 122, 122-1 of the time of flight sensor device 300 may be arranged on the substrate doping region 116 of the semiconductor substrate 110 and may be separated by an insulating material 123 from the semiconductor substrate, e.g. in form of a metallization or polysilicon region 122, 122-1 with an intermediate insulator layer 123 on the main surface region 110-A of the semiconductor substrate 110.

Alternatively, the control electrode(s) 122, 122-1 may arranged in the substrate doping region 116 of the semiconductor substrate 110 and may have the p doping type, e.g. as an implanted p doping region in the semiconductor substrate 110. Thus, the control electrode(s) 122, 122-1 of the time of flight sensor device 300 may correspond to the control electrode(s) 122, 122-1 of the time of flight sensor device 100 (e.g. as described with respect to FIGS. 1A-C and FIGS. 2A-B).

According to a further embodiment, the trench structure 150 may be laterally spaced from the substrate doping region 116, wherein at least a part of the p-doped region 110-1 of the semiconductor substrate 110 is arranged between the substrate doping region 110-1 and the trench structure 150 (see also FIG. 3B and the associated description, for example).

According to a further embodiment, the trench structure 150 may be arranged directly adjacent to the substrate doping region 116 (see also FIG. 3A and the associated description, for example).

According to a further embodiment, the time of flight sensor device 300 may further optionally comprise a trench pinning layer 156 (not shown in FIG. 6) in form of a p doped resistive region of the semiconductor substrate 110, wherein the trench pinning layer 156 is arranged adjacent to the trench structure 150 and at least between the trench structure 150 and the substrate doping region 116 and extends to the p-doped region 110-1 of the semiconductor substrate 110 (see also FIG. 3E-F and the associated description, for example).

According to a further embodiment, a further doping region (=pinning layer) 136 having a p-doping type may be optionally arranged between the control electrodes 122, 122-1 in the substrate doping region 116 adjacent to the first main surface region 110-A of the semiconductor substrate 110 (see also FIG. 1C and the associated description, for example).

According to a further embodiment, the trench structure 150 comprises a trench dielectric material with stored charge carriers 152 in the trench dielectric material adjacent to the substrate doping region 116 (see also FIG. 3G-H and the associated description, for example).

According to a further embodiment, the trench structure 150 may be buried in the semiconductor substrate 110 and extends in the p-doped region 110-1 of the semiconductor substrate 110 (see also FIG. 3D, 3F, 3H and the associated description, for example).

According to a further embodiment, the time of flight sensor device 300 may further comprise a substrate contact region 154 having the p doping type in the semiconductor substrate 110 and adjacent to the first main surface region 110 of the semiconductor substrate 110 (see also FIG. 3D, 3F, 3H and the associated description, for example).

According to an embodiment, the substrate contact region 154 is arranged between the first main surface region 110-A of the semiconductor substrate 110 and the buried trench structure 150 (see also FIG. 3D, 3F, 3H and the associated description, for example).

According to a further embodiment, the trench structure 150 extends between the substrate contact region 154 and a buried doping layer 140 (see also FIG. 3F, 3H and the associated description, for example). The buried doping layer 140 in the semiconductor substrate having a higher concentration of the p doping type than p-doped region 110-1 of the semiconductor substrate 110 may be arranged adjacent to the substrate doping region 116, wherein the buried doping layer 140 is formed in the semiconductor substrate 110 and vertically below the substrate doping region 116 in the semiconductor substrate 110. Thus, the above description of the structure and functionality of the buried doping layer 140 of the time of flight sensor device 100 (e.g. with respect to FIG. 2A-B) is equally applicable to the embodiment of the time of flight sensor device 300 as described with respect to FIG. 6.

Figure 7:
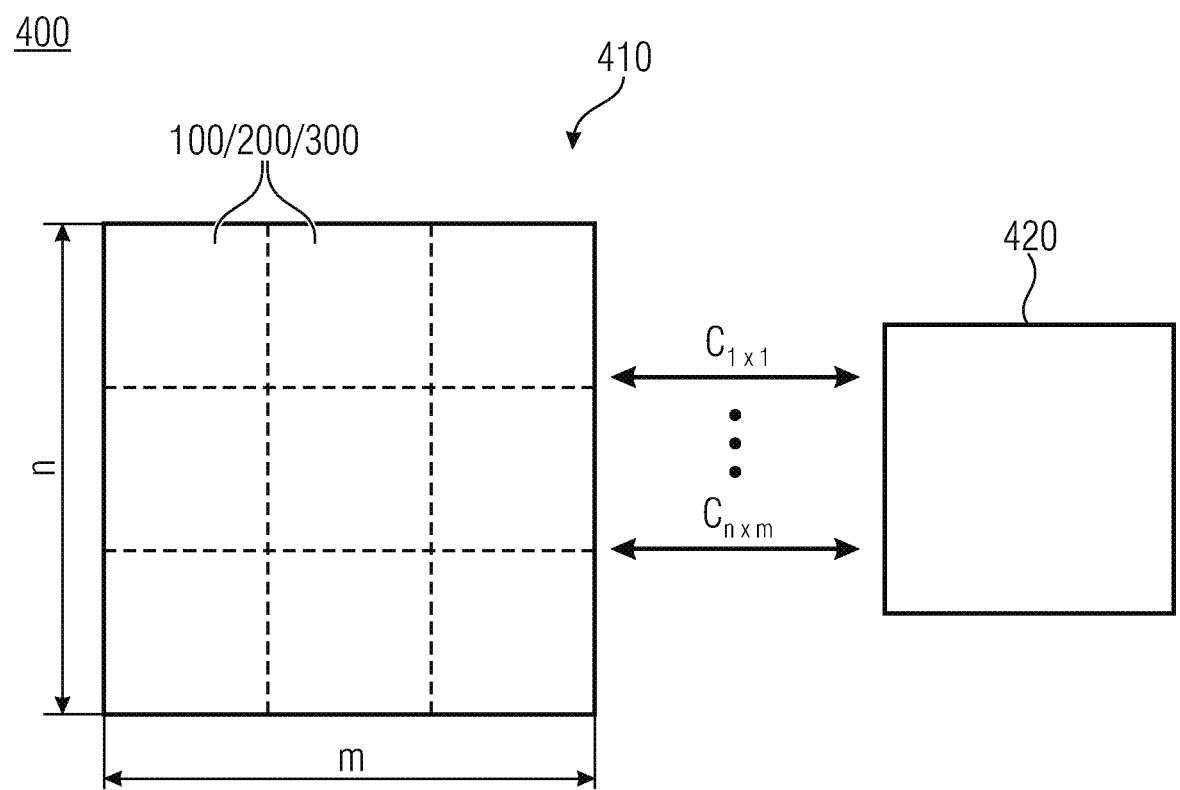
FIG. 7 shows an exemplary schematic circuit diagram of a time of flight sensor arrangement according to a further embodiment.

FIG. 7 shows an exemplary schematic circuit diagram of a time of flight sensor arrangement according to a further embodiment.

According to another embodiment, a time of flight sensor arrangement 400 comprises: a plurality of pixels respectively having one of time of flight sensor devices 100, 200, 300, wherein the pixels are arranged in an array 410 (e.g. a n×m array, with n≥2 (2, 3, 4, 5, . . . ) and m≥2 (2, 3, 4, 5, . . . ), and a controller 420 for providing a control signal $C_{xm}$ to the respective control electrode(s) 122, 122-1.

The optical time of flight sensor device 100 may be configured to detect a time of flight of the electromagnetic signal $S_0$, $S_1$, which enters the conversion region 112. To this end, the optical time of flight sensor device 100 may further comprise a controller which may be configured to apply a varying potential to the control electrode(s) 122, 122-1, to generate electrical potential distributions in the substrate doping region 116 and the conversion region 112, by which, the photo-generated charge carriers in the conversion region 112 are directed in different directions, e.g. towards the read-out region(s) 122, 122-1, dependent on the time of flight of the electromagnetic signal $S_0$, $S_1$, which enters the conversion region.

The varying potential, applied by the controller to the control electrode(s), is a demodulation signal having a fixed phase relationship with a modulation signal with which the electromagnetic signal $S_0$ is modulated.

The controller 420 may be further configured to determine the time of flight of the electro-magnetic signal $S_0$, $S_1$ based on a relationship of the amount of charge carriers collected at the first readout node 120 and/or the amount of charge carriers collected at the second readout node 120-1. In embodiments, the controller 420 may be formed of any appropriate integrated circuit and may be integrated with the optical time of flight sensor device 100. In embodiments, the controller may be provided by an integrated circuit separate from the semiconductor substrate of the optical sensor device. In embodiments, at least parts of the controller may be formed by a microprocessor or an FPGA (Field Programmable Gate Array) or an ASIC (Application-Specific Integrated Circuit).

Additional embodiments and aspects are described which may be used alone or in combination with the features and functionalities described herein.

According to an embodiment, a time of flight sensor device 100 comprises: a semiconductor substrate 110 comprising a conversion region 112 to convert an electromagnetic signal S into photo-generated charge carriers 114a, 114b, and comprising a substrate doping region 116 having a n doping type, wherein the substrate doping region 116 extends from a first main surface region 110-A of the semiconductor substrate 110 into the semiconductor substrate 110, wherein the semiconductor substrate 110 has adjacent to the substrate doping region 116 a p doped region 110-1, and wherein the substrate doping region 116 at least partially forms the conversion region 112 in the semiconductor substrate 110, a readout node 120 arranged in the semiconductor substrate 110 within the substrate doping region 116 and having the n-doping type, wherein the readout node 120 is configured to readout the photo generated charge carriers 114b; and a control electrode 122 arranged in the substrate doping region 116 of the semiconductor substrate 110 and in the substrate doping region 116 and having the p-doping type.

According to one aspect, the conversion region 112 vertically extends beyond the substrate doping region 116 in the semiconductor substrate 110.

According to another aspect, the time of flight sensor device 100 further comprises: a sensor electrode 130 which is separated by an isolating material 132 from the semiconductor substrate 130, wherein the sensor electrode 130 is configured to modify an electric potential distribution in the substrate doping region 116.

According to another aspect, the time of flight sensor device 100 further comprises: a further control electrode 122-1 arranged in the substrate doping region 116 of the semiconductor substrate 110 and having the p-doping type, and a resistive pinning layer 136 in form of a p doped resistive region of the semiconductor substrate 110, wherein the resistive pinning layer 136 is arranged in the semiconductor substrate 110 adjacent to the first main surface region 110-A and between the two control electrodes 122, 122-1.

According to another aspect, the time of flight sensor device 100 further comprises: a buried doping layer 140 in the semiconductor substrate 110 having a higher concentration of the p doping type than the p-doped region 110-1 of the semiconductor substrate 110 adjacent to the substrate doping region 116, wherein the buried doping layer 140 is formed vertically below the substrate doping region 116 in the semiconductor substrate 110.

According to another aspect, the buried doping layer 140 provides a graded doping profile in the semiconductor substrate 110 having a maximum doping concentration of the p doping type in an intermediate region 140-1 of the buried doping layer.

According to another aspect, the time of flight sensor device 100 further comprises: a trench structure 150 which is arranged laterally with respect to the substrate doping region 116 and extends vertically with respect to the first main surface region 110-a of the semiconductor substrate 110 in the semiconductor substrate 110.

According to another aspect, the trench structure 150 is arranged directly adjacent to the substrate doping region 116.

According to another aspect, the trench structure 150 is laterally spaced from the substrate doping region 116, wherein at least a part of the p-doped region 110-1 of the semiconductor substrate 110 is arranged between the substrate doping region 116 and the trench structure 150.

According to another aspect, the time of flight sensor device 100 further comprises: a trench pinning layer 156 in form of a p doped resistive region of the semiconductor substrate 110, wherein the trench pinning layer 156 is arranged adjacent to the trench structure 150 and is arranged at least between the trench structure 150 and the substrate doping region 116 and extends to the p-doped region 110-1 of the semiconductor substrate 110.

According to another aspect, the trench structure 150 comprises a trench dielectric material with stored charge carriers in the trench dielectric material adjacent to the substrate doping region 116.

According to another aspect, the trench structure 150 is buried in the semiconductor substrate 110 and reaches in the depth direction the p-doped region 110-1 of the semiconductor substrate 110.

According to another aspect, the time of flight sensor device 100 further comprises: a substrate contact region 154 having the p doping type in the semiconductor substrate 110 and adjacent to the first main surface region 110-A of the semiconductor substrate 110.

According to another aspect, the substrate contact region 116 is arranged between the first main surface region 110-A of the semiconductor substrate 110 and the trench structure 150.

According to another aspect, the buried trench structure 150 extends between the substrate contact region 154 and the buried doping layer 140.

According to another embodiment, a time of flight sensor device 200 comprises: a semiconductor substrate comprising a conversion region to convert an electromagnetic signal into photo-generated charge carriers, and comprising a substrate doping region having a n doping type, wherein the substrate doping region extends from a first main surface region of the semiconductor substrate into the semiconductor substrate, wherein the semiconductor substrate has adjacent to the substrate doping region a p-doped region 110-1, and wherein the substrate doping region at least partially forms the conversion region in the semiconductor substrate, a readout node arranged in the semiconductor substrate within the substrate doping region and having the n doping type, wherein the readout node is configured to readout the photo generated charge carriers, a control electrode arranged in or on the substrate doping region of the semiconductor substrate, and a buried doping layer 140 in the semiconductor substrate having a higher concentration of the p doping type than p-doped region of the semiconductor substrate adjacent to the substrate doping region, wherein the buried doping layer is formed in the semiconductor substrate and vertically below the substrate doping region 116 in the semiconductor substrate 110.

According to one aspect, the control electrode is arranged in in the substrate doping region and having the p doping type, or the control electrode is arranged on the substrate doping region of the semiconductor substrate and is separated by an isolating material from the semiconductor substrate.

According to another aspect, the buried doping layer provides a graded doping profile in the semiconductor substrate having a maximum doping concentration of the p doping type in an intermediate region of the buried doping layer.

According to another aspect, the time of flight sensor device further comprises: a trench structure which is arranged laterally with respect to the substrate doping region and extends vertically with respect to the first main surface region of the semiconductor substrate in the semiconductor substrate.

According to another embodiment, a time of flight sensor device 300 comprises: a semiconductor substrate comprising a conversion region to convert an electromagnetic signal into photo-generated charge carriers, and comprising a substrate doping region having a n doping type, wherein the substrate doping region extends from a first main surface region of the semiconductor substrate into the semiconductor substrate, wherein the semiconductor substrate 110 has adjacent to the substrate doping region 116 a p-doped region 110-1, and wherein the substrate doping region at least partially forms the conversion region in the semiconductor substrate, a readout node arranged in the semiconductor substrate within the substrate doping region and having the n doping type, wherein the readout node is configured to readout the photo generated charge carriers; a control electrode arranged in or on the substrate doping region of the semiconductor substrate, and a trench structure which is arranged laterally with respect to the substrate doping region and which extends vertically with respect to the first main surface region of the semiconductor substrate in the semiconductor substrate.

According to one aspect, the control electrode is arranged in the substrate doping region and having the p doping type, or wherein the control electrode is arranged on the substrate doping region of the semiconductor substrate and is separated by an isolating material from the semiconductor substrate.

According to another aspect, the trench structure is arranged directly adjacent to the substrate doping region.

According to another aspect, the trench structure is laterally spaced from the substrate doping region, wherein the p-doped region 110-1 of the semiconductor substrate 110 is arranged between the substrate doping region and the trench structure.

According to another aspect, the time of flight sensor device 300 further comprises: a trench pinning layer in form of a p doped resistive region of the semiconductor substrate, wherein the trench pinning layer is arranged adjacent to the trench structure and at least between the trench structure and the substrate doping region and extends to the p-doped region 110-1 of the semiconductor substrate.

According to another aspect, the trench structure comprises a trench dielectric material with stored charge carriers in the trench dielectric material adjacent to the substrate doping region.

According to another aspect, the trench structure is buried in the semiconductor substrate and extends in the p-doped region 110-1 of the semiconductor substrate.

According to another aspect, the time of flight sensor device 300 further comprises: a substrate contact region having the p doping type in the semiconductor substrate and adjacent to the first main surface region of the semiconductor substrate.

According to another aspect, the substrate contact region is arranged between the first main surface region of the semiconductor substrate and the trench structure.

According to another aspect, the trench structure extends between the substrate contact region and the buried doping layer 140.

According to another embodiment, a time of flight sensor arrangement 400 comprises: a plurality of the time of flight sensor devices 100, 200, 300, wherein the time of flight sensor devices 100, 200, 300 are arranged in an array, and a controller for providing a control signal to the control electrode.

Although some aspects have been described as features in the context of an apparatus it is clear that such a description may also be regarded as a description of corresponding features of a method. Although some aspects have been described as features in the context of a method, it is clear that such a description may also be regarded as a description of corresponding features concerning the functionality of an apparatus.

In the foregoing Detailed Description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, subject matter may lie in less than all features of a single disclosed example. Thus the following claims are hereby incorporated into the Detailed Description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

Although specific embodiments have been illustrated and described herein, it will be appreciated by those of ordinary skill in the art that a variety of alternate and/or equivalent implementations may be substituted for the specific embodiments shown and described without departing from the scope of the present embodiments. This application is intended to cover any adaptations or variations of the specific embodiments discussed herein. Therefore, it is intended that the embodiments be limited only by the claims and the equivalents thereof.

What is claimed is:

1. A time of flight sensor device, comprising:
   a semiconductor substrate comprising a conversion region to convert an electromagnetic signal into photo-generated charge carriers and a substrate doping region having a n-doping type, the substrate doping region extending from a first main surface region of the semiconductor substrate into the semiconductor substrate, the semiconductor substrate having a p doped region adjacent to the substrate doping region, the substrate doping region at least partially forming the conversion region in the semiconductor substrate;
   a readout node arranged in the semiconductor substrate within the substrate doping region and having the n-doping type, the readout node being configured to readout the photo generated charge carriers;
   a sensor electrode separated from the semiconductor substrate by an isolating material, the sensor electrode being configured to modify an electric potential distribution in the substrate doping region; and
   a control electrode arranged in the substrate doping region and having a p-doping type, the control electrode being configured to demodulate electrons of the photo-generated charge carriers,
   wherein the substrate doping region laterally extends uninterrupted beyond the conversion region in the semiconductor substrate.

2. The time of flight sensor device of claim 1, wherein the conversion region vertically extends beyond the substrate doping region in the semiconductor substrate.

3. The time of flight sensor device of claim 1, further comprising:
   a further control electrode arranged in the substrate doping region of the semiconductor substrate and having the p-doping type; and
   a resistive pinning layer comprising a p doped resistive region of the semiconductor substrate,
   wherein the resistive pinning layer is arranged in the semiconductor substrate adjacent to the first main surface region and between the control electrode and the further control electrode.

4. The time of flight sensor device of claim 1, further comprising:
   a buried doping layer in the semiconductor substrate and having a higher concentration of the p doping type than the p-doped region of the semiconductor substrate adjacent to the substrate doping region,
   wherein the buried doping layer is formed vertically below the substrate doping region in the semiconductor substrate.

5. The time of flight sensor device of claim 4, wherein the buried doping layer provides a graded doping profile in the semiconductor substrate having a maximum doping concentration of the p-doping type in an intermediate region of the buried doping layer.

6. The time of flight sensor device of claim 1, further comprising:
   a trench structure arranged laterally with respect to the substrate doping region and extending vertically with respect to the first main surface region of the semiconductor substrate in the semiconductor substrate.

7. The time of flight sensor device of claim 6, wherein the trench structure is arranged directly adjacent to the substrate doping region.

8. The time of flight sensor device of claim 6, wherein the trench structure is laterally spaced from the substrate doping region, and wherein at least part of the p-doped region of the semiconductor substrate is arranged between the substrate doping region and the trench structure.

9. The time of flight sensor device of claim 6, further comprising:
- a trench pinning layer comprising a p doped resistive region of the semiconductor substrate,
- wherein the trench pinning layer is arranged adjacent to the trench structure and is arranged at least between the trench structure and the substrate doping region and extends to the p-doped region of the semiconductor substrate.

10. The time of flight sensor device of claim 6, wherein the trench structure comprises a trench dielectric material with stored charge carriers in the trench dielectric material adjacent to the substrate doping region.

11. The time of flight sensor device of claim 6, wherein the trench structure is buried in the semiconductor substrate and reaches in a depth direction the p-doped region of the semiconductor substrate.

12. The time of flight sensor device of claim 6, further comprising:
- a substrate contact region having the p-doping type in the semiconductor substrate and adjacent to the first main surface region of the semiconductor substrate.

13. The time of flight sensor device of claim 12, wherein the substrate contact region is arranged between the first main surface region of the semiconductor substrate and the trench structure.

14. The time of flight sensor device of claim 11, wherein the trench structure is buried in the semiconductor substrate and reaches in a depth direction the p-doped region of the semiconductor substrate, and wherein the buried trench structure extends between the substrate contact region and the buried doping layer.

15. A time of flight sensor arrangement, comprising:
- a plurality of the time of flight sensor devices according to claim 1 and arranged in an array; and
- a controller configured to provide a control signal to the control electrode of each time of flight sensor device.

16. The time of flight sensor device of claim 1, further comprising:
- a substrate contact configured to receive and discharge holes of the photo-generated charge carriers.

17. The time of flight sensor device of claim 1, wherein the p doped region adjacent to the substrate doping region extends from the first main surface region into the semiconductor substrate.

18. The time of flight sensor device of claim 1, wherein the conversion region extends vertically, in a z-direction or depth direction, beyond the substrate doping region to a second main surface region of the semiconductor substrate.

19. A time of flight sensor device, comprising:
- a semiconductor substrate comprising a conversion region to convert an electromagnetic signal into photo-generated charge carriers and a substrate doping region having a n-doping type, the substrate doping region extending from a first main surface region of the semiconductor substrate into the semiconductor substrate, the semiconductor substrate having a p-doped region adjacent to the substrate doping region, the substrate doping region at least partially forming the conversion region in the semiconductor substrate;
- a readout node arranged in the semiconductor substrate within the substrate doping region and having the n doping type, the readout node being configured to readout the photo-generated charge carriers;
- a sensor electrode separated from the semiconductor substrate by an isolating material, the sensor electrode being configured to modify an electric potential distribution in the substrate doping region;
- a control electrode arranged in or on the substrate doping region of the semiconductor substrate, the control electrode being configured to demodulate electrons of the photo-generated charge carriers; and
- a buried doping layer in the semiconductor substrate having a higher concentration of a p-doping type than the p-doped region of the semiconductor substrate adjacent to the substrate doping region,
- wherein the buried doping layer is formed in the semiconductor substrate and vertically below the substrate doping region in the semiconductor substrate,
- wherein the substrate doping region laterally extends uninterrupted beyond the conversion region in the semiconductor substrate.

20. The time of flight sensor device of claim 19, wherein the control electrode is arranged in the substrate doping region and has the p doping type.

21. The time of flight sensor device of claim 19, wherein the buried doping layer provides a graded doping profile in the semiconductor substrate having a maximum doping concentration of the p-doping type in an intermediate region of the buried doping layer.

22. The time of flight sensor device of claim 19, further comprising:
- a trench structure arranged laterally with respect to the substrate doping region and extending vertically with respect to the first main surface region of the semiconductor substrate in the semiconductor substrate.

23. A time of flight sensor arrangement, comprising:
- a plurality of the time of flight sensor devices according to claim 19 and arranged in an array; and
- a controller configured to provide a control signal to the control electrode of each time of flight sensor device.

24. The time of flight sensor device of claim 19, wherein the conversion region extends vertically, in a z-direction or depth direction, into the buried doping layer.

25. The time of flight sensor device of claim 19, wherein the buried doping layer extends vertically, in a z-direction or depth direction, to a second main surface region of the semiconductor substrate.

* * * * *